(12) United States Patent
Nakamura

(10) Patent No.: US 10,910,741 B2
(45) Date of Patent: Feb. 2, 2021

(54) CONNECTOR ASSEMBLY, CONNECTOR PAIR OF CONNECTOR ASSEMBLY AND FORMING METHOD OF CONNECTOR ASSEMBLY

(71) Applicant: Japan Aviation Electronics Industry, Limited, Tokyo (JP)

(72) Inventor: Keisuke Nakamura, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 0 days.

(21) Appl. No.: 16/722,380

(22) Filed: Dec. 20, 2019

(65) Prior Publication Data

US 2020/0259277 A1    Aug. 13, 2020

(30) Foreign Application Priority Data

Feb. 12, 2019   (JP) .................................. 2019-022250

(51) Int. Cl.
| | | |
|---|---|---|
| H01R 12/00 | (2006.01) | |
| H01R 12/57 | (2011.01) | |
| H05K 1/14 | (2006.01) | |
| H01R 13/24 | (2006.01) | |
| H01R 12/72 | (2011.01) | |
| H01R 13/629 | (2006.01) | |
| H01R 12/79 | (2011.01) | |

(52) U.S. Cl.
CPC .......... *H01R 12/57* (2013.01); *H01R 12/721* (2013.01); *H01R 12/79* (2013.01); *H01R 13/24* (2013.01); *H01R 13/629* (2013.01); *H05K 1/14* (2013.01)

(58) Field of Classification Search
CPC ...... H01R 12/57; H01R 12/721; H01R 12/79; H01R 13/24; H01R 13/629; H05K 1/14
USPC .......................................................... 439/78
See application file for complete search history.

(56) References Cited

U.S. PATENT DOCUMENTS

| | | | | |
|---|---|---|---|---|
| 3,319,216 A | * | 5/1967 | McCullough .......... | H01R 12/87 439/493 |
| 4,367,006 A | * | 1/1983 | Rehbogen, Jr. ........ | H01R 12/82 439/495 |

(Continued)

FOREIGN PATENT DOCUMENTS

| | | |
|---|---|---|
| JP | S62-172168 U | 10/1987 |
| JP | H05-69970 U | 9/1993 |

*Primary Examiner* — Abdullah A Riyami
*Assistant Examiner* — Vladimir Imas
(74) *Attorney, Agent, or Firm* — Collard & Roe, P.C.

(57) ABSTRACT

A connector assembly comprises a main connector, a first wiring sheet and a second wiring sheet. The main connector has a receiving portion. The first wiring sheet has a first positioned portion, a first deformable portion extending from the first positioned portion and a first contact provided on the first deformable portion. The second wiring sheet has a second positioned portion, a second deformable portion extending from the second positioned portion and a second contact provided on the second deformable portion. When the connector assembly is assembled, the first positioned portion and the second positioned portion are positioned by a positioning jig. Then, the first deformable portion and the second deformable portion are pressed downward to be pushed into the receiving portion so that the first contact and the second contact are located within the receiving portion to be in contact with each other.

13 Claims, 14 Drawing Sheets

(56) References Cited

U.S. PATENT DOCUMENTS

| | | | | |
|---|---|---|---|---|
| 5,385,478 | A * | 1/1995 | Niekawa | H01H 1/36 |
| | | | | 439/347 |
| 5,882,223 | A * | 3/1999 | Igarashi | H01R 12/775 |
| | | | | 439/260 |
| 6,537,082 | B2 * | 3/2003 | Hopfer, III | H01R 12/62 |
| | | | | 439/493 |
| 7,399,192 | B2 * | 7/2008 | Yamamoto | H01R 12/79 |
| | | | | 439/260 |
| 7,410,590 | B2 * | 8/2008 | Van Schuylenbergh | |
| | | | | B81C 3/002 |
| | | | | 204/192.15 |
| 7,530,815 | B2 * | 5/2009 | Ju | H05K 3/365 |
| | | | | 439/67 |
| 8,105,102 | B2 * | 1/2012 | Sunaga | H01R 12/57 |
| | | | | 439/260 |
| 8,128,429 | B2 * | 3/2012 | Suzuki | H01R 12/707 |
| | | | | 439/493 |
| 8,241,057 | B2 * | 8/2012 | Lee | H01R 12/62 |
| | | | | 439/495 |
| 8,681,510 | B2 * | 3/2014 | Hu | H01R 12/57 |
| | | | | 361/811 |
| 9,147,970 | B2 * | 9/2015 | Hsu | H01R 12/79 |
| 9,190,747 | B2 * | 11/2015 | Tateishi | H01R 12/7017 |
| 9,780,472 | B2 * | 10/2017 | Ishimaru | H01R 12/7005 |
| 10,630,009 | B2 * | 4/2020 | Hashiguchi | H01R 12/73 |

* cited by examiner

CONNECTOR ASSEMBLY, CONNECTOR PAIR OF CONNECTOR ASSEMBLY AND FORMING METHOD OF CONNECTOR ASSEMBLY

CROSS REFERENCE TO RELATED APPLICATIONS

This application is based on and claims priority under 35 U.S.C. § 119 to Japanese Patent Application No. JP2019-022250 filed Feb. 12, 2019, the content of which is incorporated herein in its entirety by reference.

BACKGROUND OF THE INVENTION

This invention relates to a connector assembly comprising a main connector, a first wiring sheet, a second wiring sheet and an auxiliary connector.

For example, this type of connector assembly is disclosed in JP S62-172168U (Patent Document 1), the content of which is incorporated herein by reference.

Referring to FIG. 23, Patent Document 1 discloses a connector assembly 90 comprising a support plate (main connector) 92, a flexible printed circuit board (first wiring sheet) 94, another flexible printed circuit board (second wiring sheet) 96, an elastic sheet (auxiliary connector) 98 and a pressure board 99. The main connector 92 is formed with two holes 922. The auxiliary connector 98 is formed with two holes 982 which correspond to the holes 922, respectively. The first wiring sheet 94 is formed with a plurality of wiring patterns 948 and two holes 942 which correspond to the holes 922, respectively. The second wiring sheet 96 is formed with a plurality of wiring patterns 968 which correspond to the wiring patterns 948, respectively, and two holes 962 which correspond to the holes 922, respectively. The pressure board 99 has two engagement pieces 992 which correspond to the holes 922, respectively.

In an assembling step of the connector assembly 90, each of the engagement pieces 992 of the pressure board 99 is inserted into the corresponding holes 982, 962, 942 and 922 and then is bent, so that the first wiring sheet 94 and the second wiring sheet 96 are brought into close contact with each other (not shown). Meanwhile, terminals 949 of the wiring patterns 948 are brought into contact with terminals 969 of the wiring patterns 968, respectively. As a result, the first wiring sheet 94 and the second wiring sheet 96 are electrically connected with each other.

In general, when terminals of two wiring sheets, namely a first wiring sheet and a second wiring sheet, are brought into contact with each other, the two wiring sheets often fail to make good electrical connection therebetween because of foreign substances such as contaminations attached to the terminals and oxide films formed on the terminals. Therefore, when a connector assembly is assembled as disclosed in Patent Document 1, each of the first wiring sheet and the second wiring sheet needs to be subjected to a cleaning step for removing the foreign substances before the assembling step. However, such cleaning step makes manufacturing man-hours of the connector assembly higher. Thus, manufacturing time and cost of the connector assembly increase.

SUMMARY OF THE INVENTION

It is therefore an object of the present invention to provide a connector assembly comprising a first wiring sheet and a second wiring sheet which make good electrical connection with each other with no additional cleaning step in manufacture.

An aspect of the present invention provides a forming method of a connector assembly. The forming method comprises a preparation step, an arrangement step and a pressing step. In the preparation step, a main connector, a first wiring sheet, a second wiring sheet and an auxiliary connector are prepared. The main connector has a receiving portion, a first wall and a second wall. The first wall and the second wall are located opposite to each other across the receiving portion in a lateral direction. The first wiring sheet has a first positioned portion, a first deformable portion and a first contact. The first deformable portion extends from the first positioned portion along the lateral direction. The first contact is provided on the first deformable portion. The second wiring sheet has a second positioned portion, a second deformable portion and a second contact. The second deformable portion extends from the second positioned portion along the lateral direction. The second contact is provided on the second deformable portion. The auxiliary connector has a received portion. At least one of the receiving portion and the received portion is provided with a resilient portion which is resiliently deformable. In the arrangement step, the main connector, the first wiring sheet, the second wiring sheet and the auxiliary connector are arranged by using a positioning jig so that the main connector, the first wiring sheet, the second wiring sheet and the auxiliary connector are arranged in this order upward in an upper-lower direction perpendicular to the lateral direction. The positioning jig has an accommodation portion, a first positioning portion and a second positioning portion. The accommodation portion is capable of accommodating the main connector with regulation of a movement of the main connector in the lateral direction. Each of the first positioning portion and the second positioning portion is located, at least in part, outward of the accommodation portion in the lateral direction. The main connector is accommodated in the accommodation portion. The first contact is arranged to face upward. The first positioned portion is positioned by the first positioning portion. The first deformable portion is located to extend over the receiving portion onto the second wall. The second contact is arranged to face downward. The second positioned portion is positioned by the second positioning portion. The second deformable portion is located on the first deformable portion to extend over the receiving portion onto the first wall. The received portion is located on the receiving portion via the first deformable portion and the second deformable portion. In the pressing step, the auxiliary connector is moved downward to press the first deformable portion and the second deformable portion downward by the received portion so that the first deformable portion and the second deformable portion are deformed and pushed into the receiving portion. When the pressing step is ended, the first contact and the second contact are located within the receiving portion to be in contact with each other, and the resilient portion applies a resilient force that keeps the first contact and the second contact in contact with each other.

According to an aspect of the present invention, as a result of the arrangement step, the first positioning portion and the second positioning portion, which are located opposite to each other in the lateral direction, position the first positioned portion and the second positioned portion, respectively. Meanwhile, the first deformable portion which extends from the first positioned portion and the second deformable portion which extends from the second positioned portion are located over the receiving portion under a state where the first contact provided on the first deformable portion faces upward and the second contact provided on the second deformable portion faces downward. When the first deformable portion and the second deformable portion arranged as described above are pressed downward in the pressing step, the first deformable portion and the second deformable portion are deformed so that the first contact and the second contact are rubbed against each other. This rubbing makes the first contact and the second contact clean by the end of the pressing step. Thus, an aspect of the present invention provides the connector assembly comprising the first wiring sheet and the second wiring sheet which make good electrical connection with each other with no additional cleaning step in manufacture.

An appreciation of the objectives of the present invention and a more complete understanding of its structure may be had by studying the following description of the preferred embodiment and by referring to the accompanying drawings.

Figure 1:
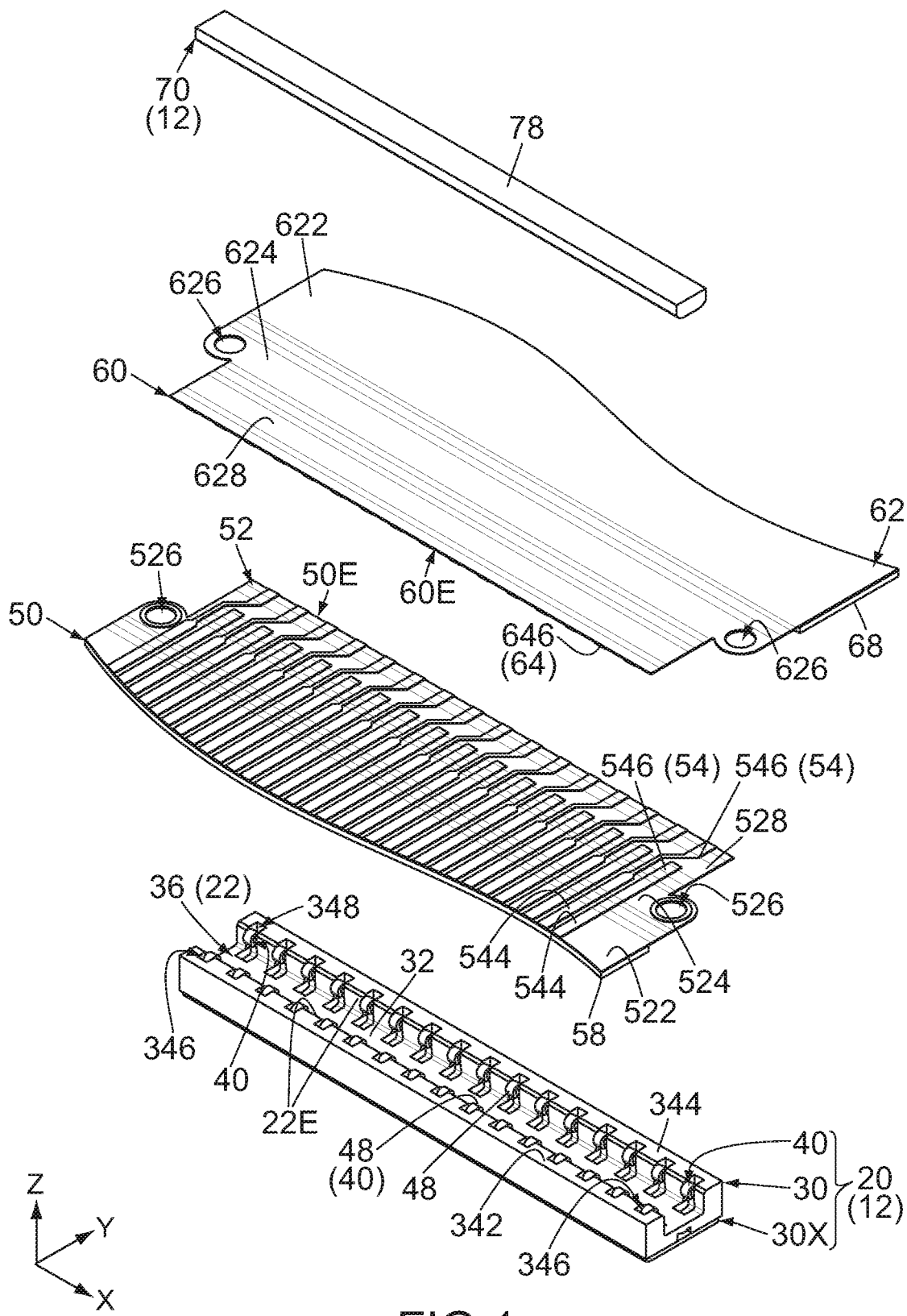
FIG. 1 is an exploded, perspective view showing a connector assembly according to an embodiment of the present invention, wherein for each of a first wiring sheet and a second wiring sheet of the connector assembly, the figure illustrates only an end part thereof in a lateral direction.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

Figure 2:
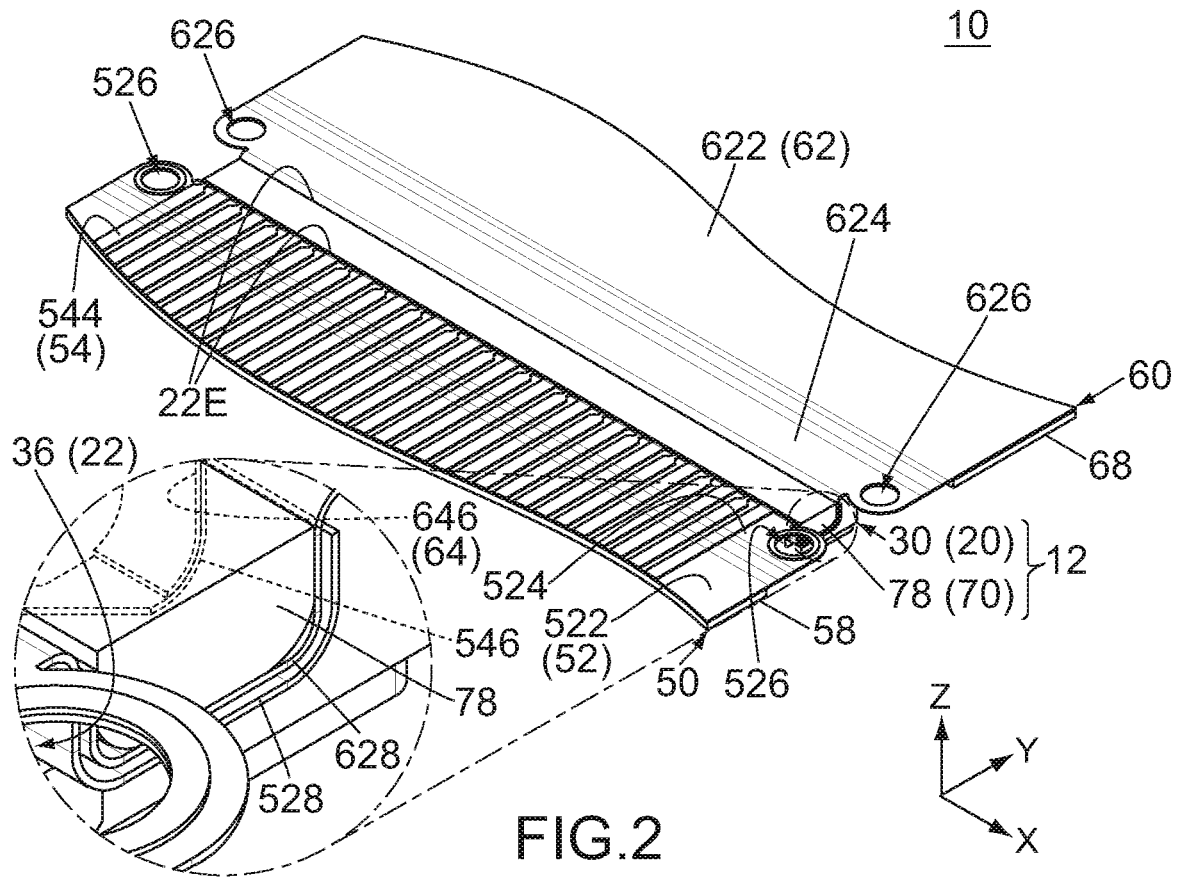
FIG. 2 is a perspective view showing the connector assembly of FIG. 1 under its assembled state, wherein a part of the connector assembly enclosed by chain dotted lines is enlarged and illustrated, and hidden outlines of the first wiring sheet and the second wiring sheet in the enlarged view are illustrated with dashed line.
Figure 3:
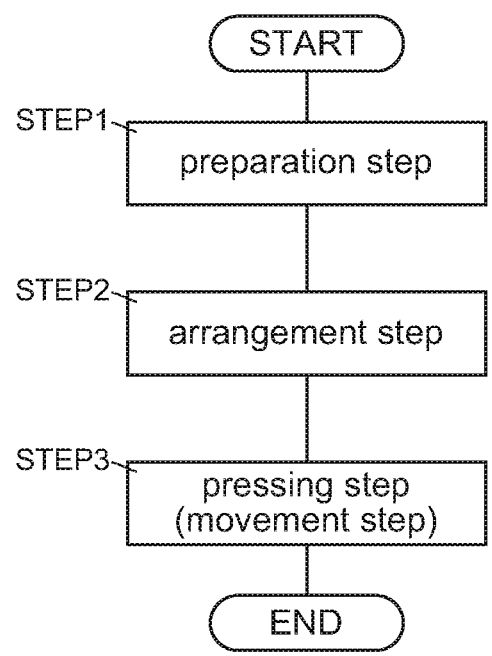
FIG. 3 is a flowchart showing a forming method for assembling the connector assembly of FIG. 2 from members of the connector assembly of FIG. 1.

Referring to FIGS. 1 and 2, a connector assembly 10 of an embodiment of the present invention comprises a main connector 20, a first wiring sheet 50, a second wiring sheet 60 and an auxiliary connector 70. The connector assembly 10 is an assembly for electrically connecting the first wiring sheet 50 and the second wiring sheet 60 with each other. Referring to FIG. 3, the connector assembly 10 of the present embodiment shown in FIGS. 1 and 2 is formed via at least three manufacturing steps, namely a preparation step (STEP 1), an arrangement step (STEP 2) and a movement step (STEP 3) which includes a pressing step. Hereafter, explanation will be made about the manufacturing steps of the connector assembly 10 of the present embodiment along starting order of the manufacturing steps.

Referring to FIG. 1, the main connector 20, the first wiring sheet 50, the second wiring sheet 60 and the auxiliary connector 70 are prepared in the first step, or in the preparation step (see FIG. 3). Hereafter, explanation will be made about the structure of each member prepared in the preparation step.

Figure 5:
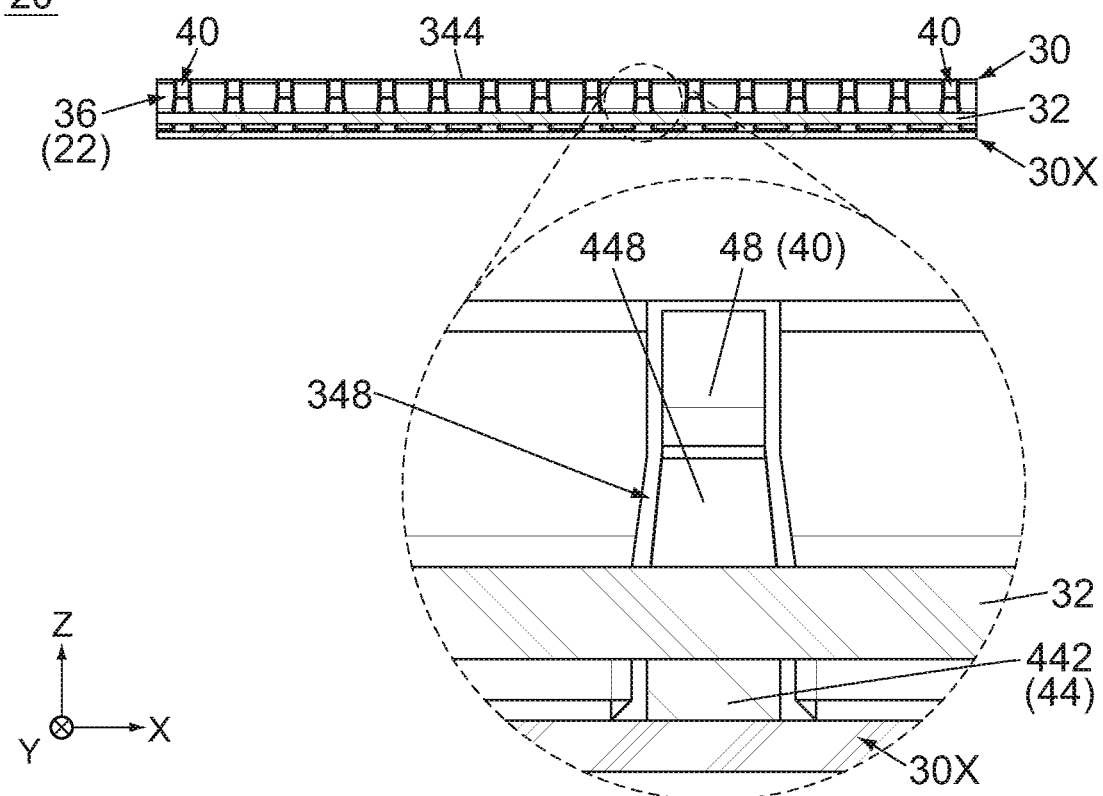
FIG. 5 is a cross-sectional view showing the main connector of FIG. 4, taken along line V-V, wherein a part of the main connector is enlarged and illustrated.
Figure 6:
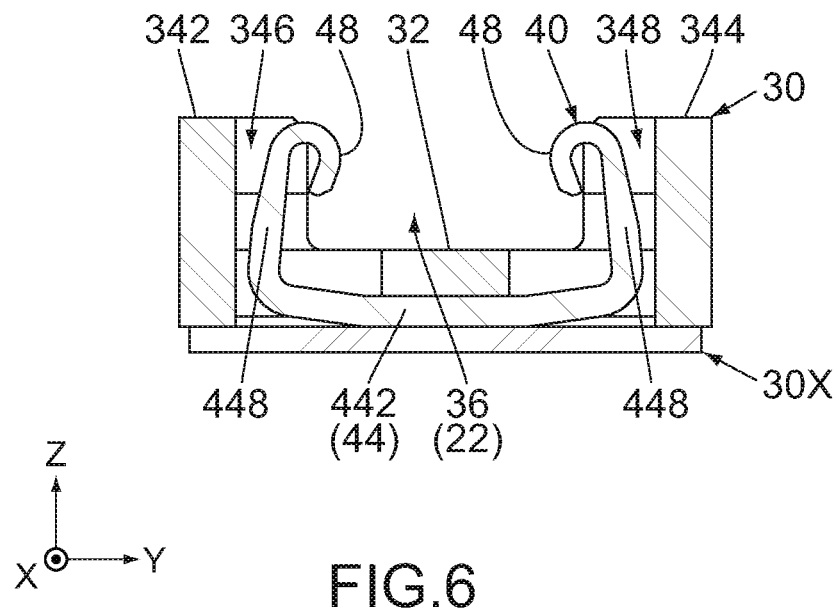
FIG. 6 is a cross-sectional view showing the main connector of FIG. 4, taken along line VI-VI.

Referring to FIGS. 1, 5 and 6, the main connector 20 of the present embodiment comprises a base member 30X made of insulator, a holding member 30 made of insulator and a plurality of resilient members (resilient portions) 40 each made of metal. The base member 30X has a flat-plate shape in parallel to a horizontal plane (XY-plane). The holding member 30 is attached on the base member 30X in an upper-lower direction (Z-direction). In the present embodiment, each of the resilient members 40 is held by the holding member 30 and the base member 30X. The main connector 20 of the present embodiment is formed of the aforementioned members. However, the present invention is not limited thereto. For example, the base member 30X may be provided as necessary. When the base member 30X is not provided, each of the resilient members 40 may be held only by the holding member 30. Instead, the main connector 20 may further comprise another member.

Figure 4:
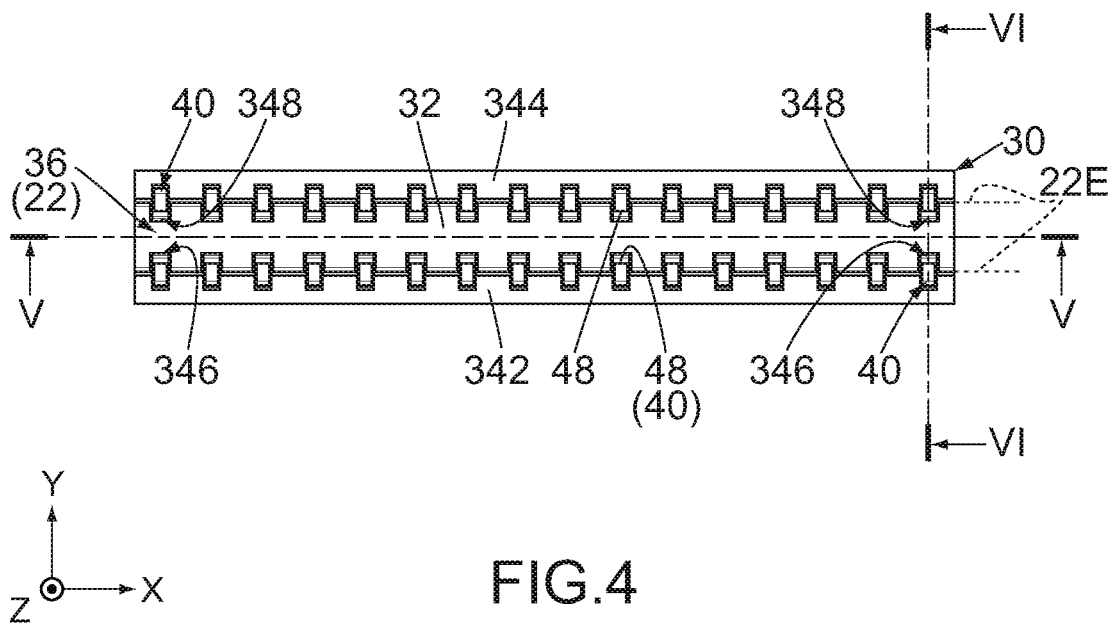
FIG. 4 is a top view showing a main connector of the connector assembly of FIG. 1, wherein positions of opposite edges of a receiving portion in the lateral direction are illustrated with dashed line.

As shown in FIGS. 1, 4 and 6, the holding member 30 of the present embodiment has a bottom portion 32, a first wall 342, a second wall 344 and a recessed portion 36. Thus, the main connector 20 of the present embodiment has the bottom portion 32, the first wall 342, the second wall 344 and the recessed portion 36 each of which is formed as a part of the holding member 30.

The bottom portion 32 has a flat-plate shape in parallel to the XY-plane. The bottom portion 32 has an upper surface, or a positive Z-side surface, which is a plane in parallel to the XY-plane. The first wall 342 and the second wall 344 are located at opposite sides of the holding member 30, respectively, in a lateral direction (Y-direction) perpendicular to the Z-direction. Each of the first wall 342 and the second wall 344 projects upward, or in the positive Z-direction, from the bottom portion 32 and extends along a pitch direction (X-direction) perpendicular to both the Y-direction and the Z-direction. Each of the first wall 342 and the second wall 344 has an upper surface which is a plane in parallel to the XY-plane. The recessed portion 36 is a space located on the bottom portion 32. The recessed portion 36 extends along the X-direction. The recessed portion 36 is located between the first wall 342 and the second wall 344 in the Y-direction. Thus, the first wall 342 and the second wall 344 face each other across the recessed portion 36 in the Y-direction.

The first wall 342 has a plurality of first accommodation portions 346. The second wall 344 has a plurality of second accommodation portions 348. Each of the first accommodation portions 346 is a space formed in the first wall 342. Each of the first accommodation portions 346 opens upward and inward in the Y-direction. Each of the second accommodation portions 348 is a space formed in the second wall 344. Each of the second accommodation portions 348 opens upward and inward in the Y-direction. Thus, each of the first accommodation portions 346 and the second accommodation portions 348 opens toward the recessed portion 36.

The first accommodation portions 346 are arranged at regular intervals in the X-direction. The second accommodation portions 348 are arranged at regular intervals in the X-direction. The second accommodation portions 348 are provided so as to correspond to the first accommodation portions 346, respectively. More specifically, the first accommodation portions 346 are arranged to be mirror image of the second accommodation portions 348 with respect to the XZ-plane. Each of the thus-arranged first accommodation portions 346 faces the corresponding second accommodation portion 348 across the recessed portion 36 in the Y-direction.

The holding member 30 of the present embodiment has the aforementioned structure. However, the present invention is not limited thereto. For example, each part such as the first wall 342 may be a part of a member other than the holding member 30. Moreover, the upper surface of each of the first wall 342 and the second wall 344 is not limited to a flat plane.

Referring to FIG. 1, the resilient members 40 have shapes same as one another. As shown in FIG. 6, each of the resilient members 40 has a resilient support portion 44 and two projecting portions 48. The resilient support portion 44 has a mirror-symmetrical shape with respect to the XZ-plane and extends along the Y-direction as a whole. The resilient support portion 44 supports each of the projecting portions 48. The two projecting portions 48 are located at opposite ends of the resilient support portion 44 in the Y-direction, respectively, and are arranged to be mirror images to each other with respect to the XZ-plane.

Each of the resilient support portions 44 has a held portion 442 and two spring portions 448 which correspond to the two projecting portions 48, respectively. Referring to FIGS. 5 and 6, the held portion 442 is sandwiched and held between the bottom portion 32 and the base member 30X in the Z-direction and extends along the Y-direction. Referring to FIG. 6, the two spring portions 448 are provided on opposite ends of the held portion 442 in the Y-direction, respectively. Each of the spring portions 448 extends upward from the held portion 442 and supports the corresponding projecting portion 48. The two projecting portions 48 face each other in the Y-direction. Each of the spring portions 448 is resiliently deformable. Each of the projecting portions 48 projects inward in the Y-direction from the corresponding spring portion 448 and is movable in the Y-direction in accordance with resilient deformation of the corresponding spring portion 448.

Referring to FIGS. 1 and 4, the resilient members 40 are arranged so as to correspond to the first accommodation portions 346 of the holding member 30, respectively, and so as to correspond to the second accommodation portions 348 of the holding member 30, respectively. Moreover, the resilient members 40 are arranged at regular intervals in the X-direction. Thus, the main connector 20 of the present embodiment comprises a plurality of sets, each of which consists of one of the resilient members 40, one of the first accommodation portions 346 and one of the second accommodation portions 348. Referring to FIG. 6, for each of the resilient members 40, the two spring portions 448 are accommodated within the corresponding first accommodation portion 346 and the corresponding second accommodation portion 348, respectively. For each of the resilient members 40, the two projecting portions 48 are partially accommodated within the corresponding first accommodation portion 346 and the corresponding second accommodation portion 348, respectively. Each of the thus-arranged projecting portions 48 is partially located within the recessed portion 36.

Referring to FIGS. 1 and 4, the main connector 20 has a receiving portion 22. The receiving portion 22 of the present embodiment is formed of the recessed portion 36 and the resilient members 40 and extends along the X-direction. The first wall 342 and the second wall 344 are located opposite to each other across the receiving portion 22 in the Y-direction. The receiving portion 22 is provided with the bottom portion 32. The bottom portion 32 is located at a lower end, or a negative Z-side end, of the receiving portion 22.

Referring to FIG. 1, the recessed portion 36 of the receiving portion 22 is a part for partially receiving the auxiliary connector 70 together with a part of the first wiring sheet 50 and a part of the second wiring sheet 60. The resilient members 40 of the receiving portion 22 are members for sandwiching and pressing the parts received in the recessed portion 36 in the Y-direction by their resilient forces. The structure of the main connector 20 can be variously modified, provided that the receiving portion 22 which works as described above is provided.

For example, each of the first wall 342 and the second wall 344 may be formed of elastomer. In this modification, the main connector 20 does not need to comprise the resilient members 40, and the receiving portion 22 may consist of only the recessed portion 36. When the main connector 20 comprises none of the resilient members 40, the first wall 342 does not need to be provided with the first accommodation portions 346 which accommodate the projecting portions 48 of the resilient members 40, and the second wall 344 does not need to be provided with the second accommodation portions 348 which accommodate the projecting portions 48. Moreover, the number of the sets, each of which consists of one of the resilient members 40, one of the first accommodation portions 346 and one of the second accommodation portions 348, may be one or more. For example, the main connector 20 may comprise only one of the resilient members 40, only one of the first accommodation portions 346 and only one of the second accommodation portions 348.

Figure 7:
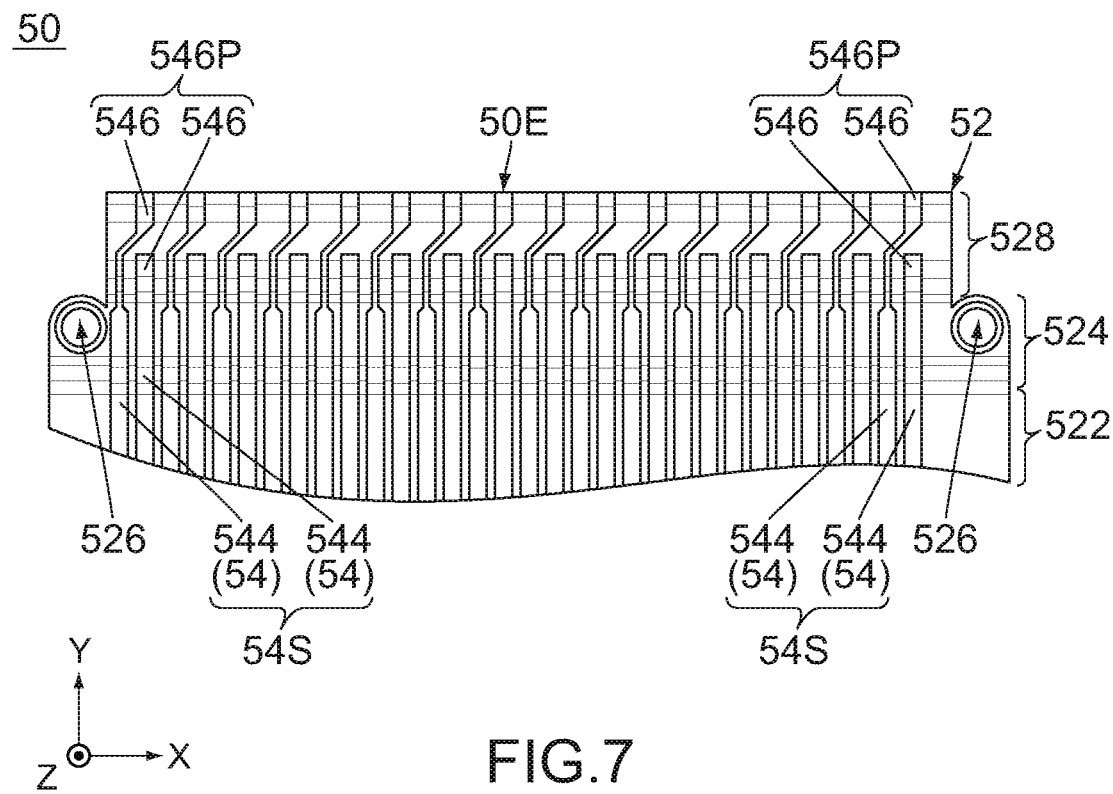
FIG. 7 is a top view showing the first wiring sheet of the connector assembly of FIG. 1.
Figure 8:
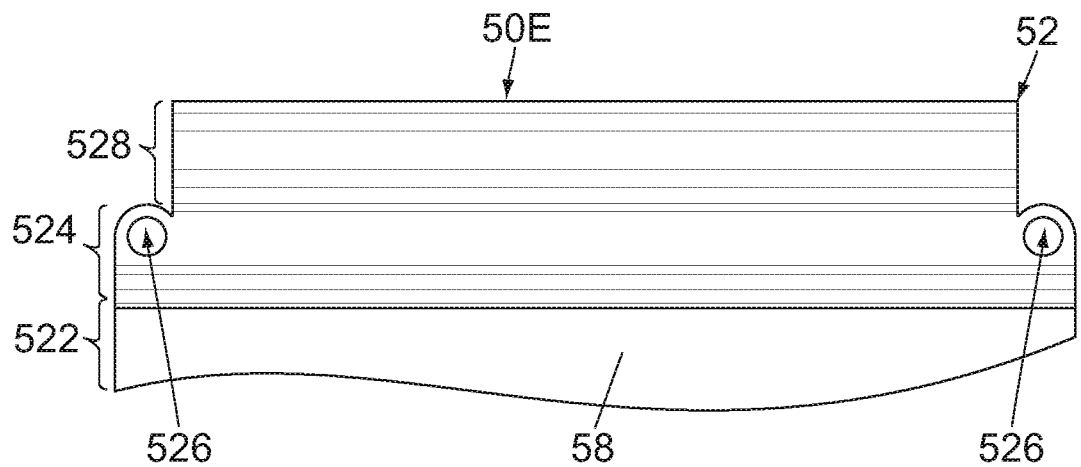
FIG. 8 is a bottom view showing the first wiring sheet of FIG. 7.

Referring to FIGS. 1, 7 and 8, the first wiring sheet 50 of the present embodiment extends in parallel to the XY-plane. The first wiring sheet 50 has a first end 50E that is a positive Y-side end thereof in the Y-direction. The first wiring sheet 50 extends from the first end 50E along a direction away from the first end 50E in the Y-direction, or along a first predetermined direction (negative Y-direction). The whole first wiring sheet 50 (not shown) is longer than the illustrated first wiring sheet 50 in the Y-direction. In other words, the illustrated first wiring sheet 50 is a part of the whole first wiring sheet 50 and a part including the first end 50E. The first wiring sheet 50 comprises a first insulation sheet 52 made of insulator, a plurality of first conductive patterns 54 each made of conductor and a first reinforcement plate 58 made of insulator. The first insulation sheet 52 is a thin sheet extending in parallel to the XY-plane. The first reinforcement plate 58 is attached to a lower surface, or a negative Z-side surface, of the first insulation sheet 52. The first conductive patterns 54 are formed on an upper surface of the first insulation sheet 52.

Referring to FIGS. 1 and 7, the first wiring sheet 50 comprises flexible printed circuits (FPC) formed of the first insulation sheet 52 and the first conductive patterns 54. The FPC of the first wiring sheet 50 have flexibility and are bendable without breaking. Referring to FIGS. 1 and 8, the first reinforcement plate 58 reinforces and supports the easily bendable FPC of the first wiring sheet 50 so that the FPC extend in a flat plane. However, the first reinforcement plate 58 may be provided as necessary. Thus, the whole first wiring sheet 50 may be the FPC. Instead, the first wiring sheet 50 may further comprise another member.

As shown in FIGS. 1, 7 and 8, the first wiring sheet 50 of the present embodiment has a first body portion 522, a first positioned portion 524 and a first deformable portion 528. Each of the first body portion 522, the first positioned portion 524 and the first deformable portion 528 is a part of the first insulation sheet 52 and extends between opposite ends of the first wiring sheet 50 in the X-direction. Each of the first positioned portion 524 and the first deformable portion 528 extends in belt-like form along the X-direction. The first body portion 522 is reinforced by the first reinforcement plate 58. The whole first body portion 522 (not shown) extends longer than the illustrated first body portion 522 along the negative Y-direction.

The first deformable portion 528, the first positioned portion 524 and the first body portion 522 are arranged from the first end 50E in this order along the negative Y-direction and are connected to one another. In detail, the first deformable portion 528 extends from the first end 50E along the negative Y-direction. The first positioned portion 524 extends from the first deformable portion 528 along the negative Y-direction while protruding in opposite directions in the X-direction. In other words, the first deformable portion 528 extends from the first positioned portion 524 to the first end 50E along the Y-direction. The first body portion 522 extends from the first positioned portion 524 along the negative Y-direction.

According to the present embodiment, the first positioned portion 524 is provided with two first positioned holes 526. Each of the first positioned holes 526 is a hole which passes through the first positioned portion 524 in the Z-direction. The two first positioned holes 526 are located in the vicinities of opposite ends of the first positioned portion 524 in the X-direction, respectively. Referring to FIG. 1, as described later, the first positioned holes 526 are used to position the first positioned portion 524 relative to the main connector 20 and to arrange the first wiring sheet 50 at a predetermined position in the XY-plane, namely a first predetermined position.

The first insulation sheet 52 of the present embodiment has the aforementioned structure. However, the structure of the first insulation sheet 52 can be variously modified, provided that the first insulation sheet 52 has the first positioned portion 524 and the first deformable portion 528 connected to each other in the Y-direction. For example, the first positioned portion 524 may have recesses instead of the first positioned holes 526. These recesses may be formed so that the opposite ends of the first positioned portion 524 in the X-direction are recessed inward in the X-direction.

Referring to FIGS. 1 and 7, each of the first conductive patterns 54 has a first pattern 544, a first contact 546 and a first terminal (not shown). Each of the first contacts 546 is arranged on the first deformable portion 528. Thus, the first wiring sheet 50 has the first contacts 546 provided on the first deformable portion 528. Each of the first patterns 544 extends from the first contact 546 along the negative Y-direction. Although not shown in figures, each of the first terminals is near to the end of the first wiring sheet 50 opposite to the first end 50E in the Y-direction. Each of the first terminals is connected to a first object (not shown) when the connector assembly 10 is used. Each of the illustrated first patterns 544 is exposed upward. However, the present invention is not limited thereto. For example, each of the first patterns 544 may be coated with resist.

Referring to FIG. 7, the first conductive patterns 54 are arranged in the X-direction. In the present embodiment, the first insulation sheet 52 is formed with 2×N (N is an integer of one or more) of the first conductive patterns 54. Two of the first conductive patterns 54 adjacent to each other in the X-direction form one first conductive set 54S. Thus, the first insulation sheet 52 is formed with N of the first conductive sets 54S.

The two first patterns 544 of each of the first conductive sets 54S have shapes different from each other. In each of the first conductive sets 54S, one of the two first patterns 544 linearly extends along the Y-direction, and a remaining one of the two first patterns 544 extends along the Y-direction while being partially inclined in the X-direction. The two first contacts 546 of each of the first conductive sets 54S form one first contact pair 546P. The two first contacts 546 of each of the first contact pairs 546P are located at positions same as each other in the X-direction and are adjacent to each other in the Y-direction.

Referring to FIG. 1 together with FIG. 7, the first contact pairs 546P of the first conductive sets 54S are provided so as to correspond to the resilient members 40 of the main connector 20, respectively. When the first wiring sheet 50 is arranged at the first predetermined position over the main connector 20, each of the first contact pairs 546P is located above the corresponding resilient member 40.

Referring to FIG. 7, the first conductive patterns 54 of the present embodiment are arranged as described above. However, the arrangement of the first conductive patterns 54 can be variously modified, provided that each of the first contacts 546 is located on the first deformable portion 528. For example, the first conductive patterns 54 may have shapes same as one another. More specifically, each of the first conductive patterns 54 may linearly extend along the Y-direction. In this modification, all the first contacts 546 may extend to the first end 50E and may be arranged in line in the X-direction. Moreover, the first insulation sheet 52 may be provided with at least one of the first conductive patterns 54.

Figure 9:
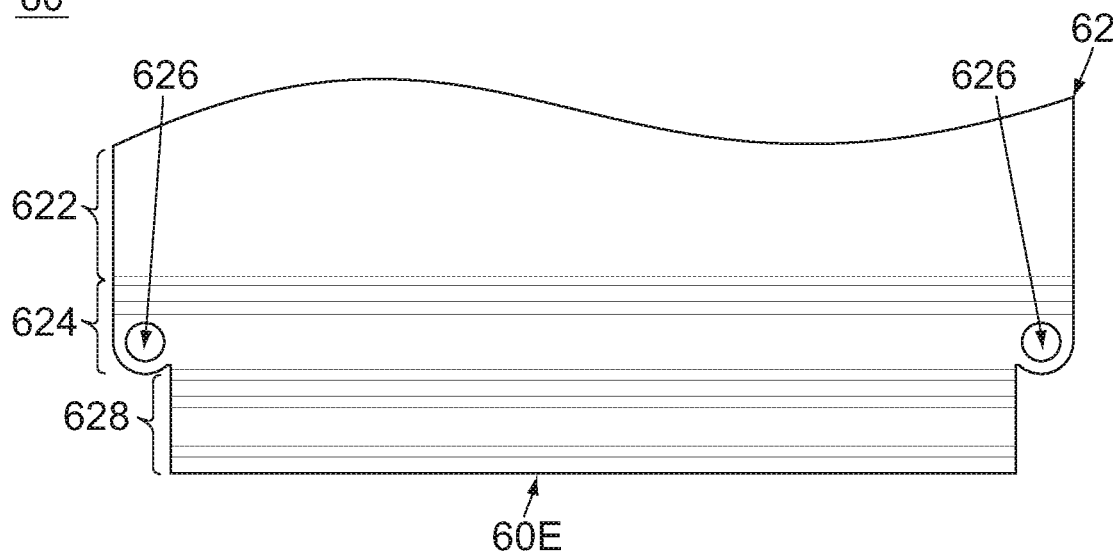
FIG. 9 is a top view showing the second wiring sheet of the connector assembly of FIG. 1.
Figure 10:
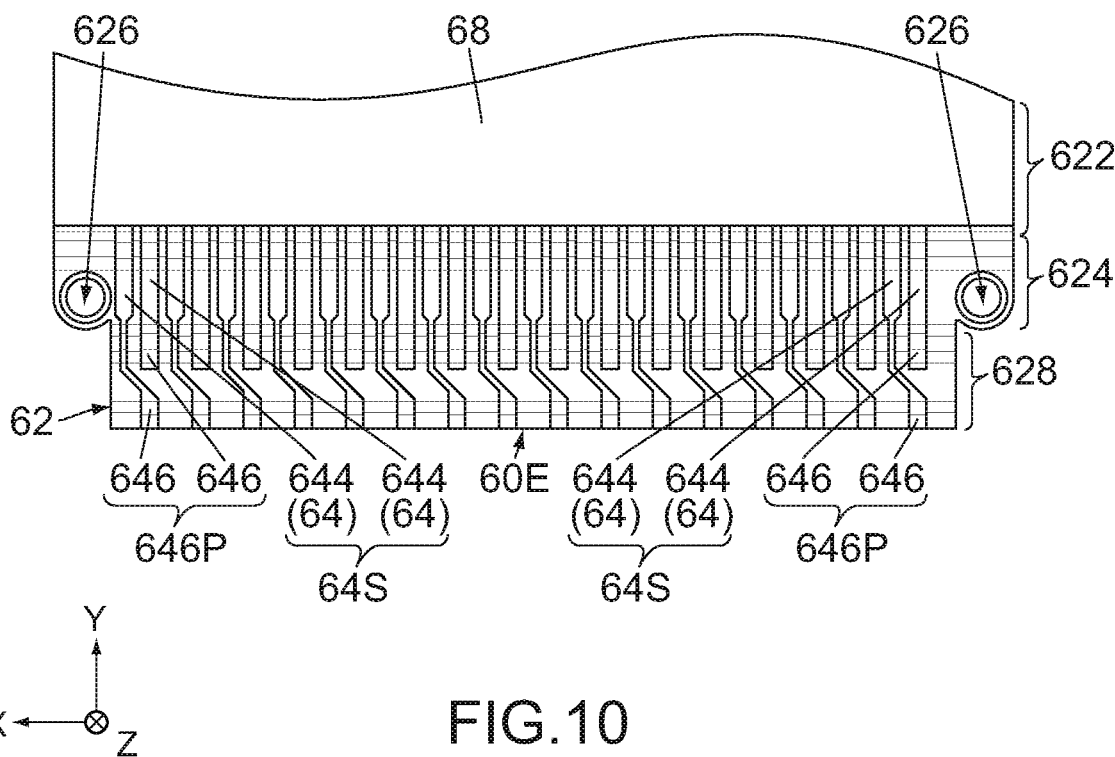
FIG. 10 is a bottom view showing the second wiring sheet of FIG. 9.

Referring to FIGS. 1, 9 and 10, the second wiring sheet 60 of the present embodiment extends in parallel to the XY-plane. The second wiring sheet 60 has a second end 60E that is a negative Y-side end thereof in the Y-direction. The second wiring sheet 60 extends from the second end 60E along a direction away from the second end 60E in the Y-direction, or along a second predetermined direction (positive Y-direction). The whole second wiring sheet 60 (not shown) is longer than the illustrated second wiring sheet 60 in the Y-direction. In other words, the illustrated second wiring sheet 60 is a part of the whole second wiring sheet 60 and a part including the second end 60E. The second wiring sheet 60 comprises a second insulation sheet 62 made of insulator, a plurality of second conductive patterns 64 each made of conductor and a second reinforcement plate 68 made of insulator. The second insulation sheet 62 is a thin sheet extending in parallel to the XY-plane. The second reinforcement plate 68 is attached to a lower surface of the second insulation sheet 62. The second conductive patterns 64 are formed on the lower surface of the second insulation sheet 62.

Referring to FIGS. 1 and 10, the second wiring sheet 60 comprises FPC formed of the second insulation sheet 62 and the second conductive patterns 64. The FPC of the second wiring sheet 60 have flexibility and are bendable without breaking. The second reinforcement plate 68 reinforces and supports the easily bendable FPC of the second wiring sheet 60 so that the FPC extend in a flat plane. However, the second reinforcement plate 68 may be provided as necessary. Thus, the whole second wiring sheet 60 may be the FPC. Instead, the second wiring sheet 60 may further comprise another member.

As shown in FIGS. 1, 9 and 10, the second wiring sheet 60 of the present embodiment has a second body portion 622, a second positioned portion 624 and a second deformable portion 628. Each of the second body portion 622, the second positioned portion 624 and the second deformable portion 628 is a part of the second insulation sheet 62 and extends between opposite ends of the second wiring sheet 60 in the X-direction. Each of the second positioned portion 624 and the second deformable portion 628 extends in belt-like form along the X-direction. The second body portion 622 is reinforced by the second reinforcement plate 68. The whole second body portion 622 (not shown) extends longer than the illustrated second body portion 622 along the positive Y-direction.

The second deformable portion 628, the second positioned portion 624 and the second body portion 622 are arranged from the second end 60E in this order along the positive Y-direction and are connected to one another. In detail, the second deformable portion 628 extends from the second end 60E along the positive Y-direction. The second positioned portion 624 extends from the second deformable portion 628 along the positive Y-direction while protruding in opposite directions in the X-direction. In other words, the second deformable portion 628 extends from the second positioned portion 624 to the second end 60E along the Y-direction. The second body portion 622 extends from the second positioned portion 624 along the positive Y-direction.

According to the present embodiment, the second positioned portion 624 is provided with two second positioned holes 626. Each of the second positioned holes 626 is a hole which passes through the second positioned portion 624 in the Z-direction. The two second positioned holes 626 are located in the vicinities of opposite ends of the second positioned portion 624 in the X-direction, respectively. Referring to FIG. 1, as described later, the second positioned holes 626 are used to position the second positioned portion 624 relative to the main connector 20 and to arrange the second wiring sheet 60 at a predetermined position in the XY-plane, namely a second predetermined position.

The second insulation sheet 62 of the present embodiment has the aforementioned structure. However, the structure of the second insulation sheet 62 can be variously modified, provided that the second insulation sheet 62 has the second positioned portion 624 and the second deformable portion 628 connected to each other in the Y-direction. For example, the second positioned portion 624 may have recesses instead of the second positioned holes 626. These recesses may be formed so that the opposite ends of the second positioned portion 624 in the X-direction are recessed inward in the X-direction.

Referring to FIG. 10, each of the second conductive patterns 64 has a second pattern 644, a second contact 646 and a second terminal (not shown). Each of the second contacts 646 is arranged on the second deformable portion 628. Thus, the second wiring sheet 60 has the second contacts 646 provided on the second deformable portion 628. Each of the second patterns 644 extends from the second contact 646 along the positive Y-direction. Although not shown in figures, each of the second terminals is near to the end of the second wiring sheet 60 opposite to the second end 60E in the Y-direction. Each of the second terminals is connected to a second object (not shown) when the connector assembly 10 (see FIG. 2) is used. Each of the illustrated second patterns 644 is mostly covered by the second reinforcement plate 68 and partially exposed downward, or in the negative Z-direction. However, the present invention is not limited thereto. For example, the exposed part of each of the second patterns 644 may be coated with resist.

The second conductive patterns 64 are arranged in the X-direction. In the present embodiment, the second insulation sheet 62 is formed with 2×N (N is an integer of one or more) of the second conductive patterns 64 which correspond to the first conductive patterns 54 (see FIG. 1) of the first wiring sheet 50 (see FIG. 1), respectively. Two of the second conductive patterns 64 adjacent to each other in the X-direction form one second conductive set 64S. Thus, the second insulation sheet 62 is formed with N of the second conductive sets 64S.

The two second patterns 644 of each of the second conductive sets 64S have shapes different from each other. In each of the second conductive sets 64S, one of the two second patterns 644 linearly extends along the Y-direction, and a remaining one of the two second patterns 644 extends along the Y-direction while being partially inclined in the X-direction. The two second contacts 646 of each of the second conductive sets 64S form one second contact pair 646P. The two second contacts 646 of each of the second contact pairs 646P are located at positions same as each other in the X-direction and are adjacent to each other in the Y-direction.

Referring to FIG. 1 together with FIG. 10, the second contact pairs 646P of the second conductive sets 64S are provided so as to correspond to the resilient members 40 of the main connector 20, respectively. When the second wiring sheet 60 is arranged at the second predetermined position over the main connector 20, each of the second contact pairs 646P is located above the corresponding resilient member 40.

Referring to FIG. 10, the second conductive patterns 64 of the present embodiment are arranged as described above. However, the arrangement of the second conductive patterns 64 can be variously modified, provided that each of the second contacts 646 is located on the second deformable portion 628. For example, the second conductive patterns 64 may have shapes same as one another. More specifically, each of the second conductive patterns 64 may linearly extend along the Y-direction. In this modification, all the second contacts 646 may extend to the second end 60E and may be arranged in line in the X-direction. Moreover, the second insulation sheet 62 may be provided with at least one of the second conductive patterns 64.

Figure 11:
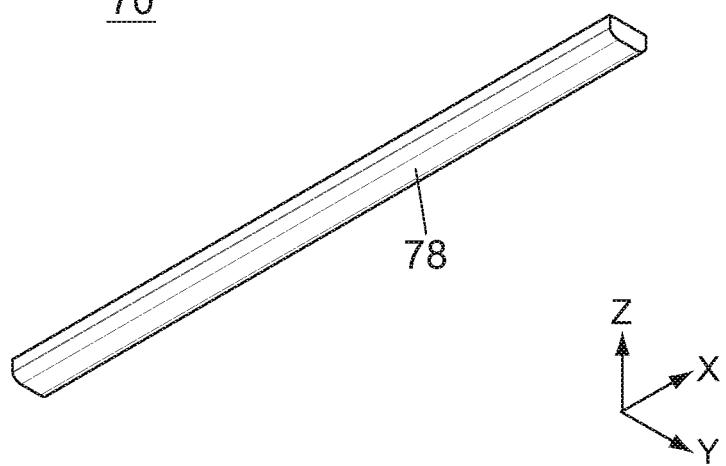
FIG. 11 is a perspective view showing an auxiliary connector of the connector assembly of FIG. 1.

Referring to FIGS. 1 and 11, the auxiliary connector 70 of the present embodiment is made of insulator and has a flat-plate shape in parallel to the XY-plane. The auxiliary connector 70 has a received portion 78. The received portion 78 linearly extends along the X-direction. Referring to FIG. 1, a size of the received portion 78 in the Y-direction is smaller than another size of the recessed portion 36 of the main connector 20 in the Y-direction. The receiving portion 22 of the main connector 20 is capable of receiving, at least in part, the thus-formed received portion 78.

The auxiliary connector 70 of the present embodiment has the aforementioned structure. The auxiliary connector 70 of the present embodiment is a single member having only the received portion 78 and extends along the X-direction while having a constant shape in a perpendicular plane (YZ-plane) perpendicular to the X-direction. More specifically, the auxiliary connector 70 of the present embodiment has a chamfered rectangular shape in the YZ-plane. The thus-shaped auxiliary connector 70 can be easily formed. However, the present invention is not limited thereto. For example, the auxiliary connector 70 may have another part in addition to the received portion 78 and may comprise a plurality of members. Moreover, the size and shape of the received portion 78 are not specifically limited, provided that the received portion 78 can be received in the receiving portion 22.

Referring to FIG. 1, the recessed portion 36 of the receiving portion 22 of the main connector 20 is a part for receiving the received portion 78 of the auxiliary connector 70 together with the first deformable portion 528 of the first wiring sheet 50 and the second deformable portion 628 of the second wiring sheet 60. Each of the resilient portions 40 of the receiving portion 22 is a part for sandwiching and pressing the received portion 78, the first deformable portion 528 and the second deformable portion 628, which are received in the recessed portion 36, in the Y-direction by its resilient force. According to the present embodiment, the receiving portion 22 is provided with the resilient portions 40, while the received portion 78 is provided with no resilient portion. However, the present invention is not limited thereto. For example, the received portion 78 may be provided with resilient portions, while the receiving portion 22 may be provided with none of the resilient portions 40. Moreover, each of the receiving portion 22 and the received portion 78 may be provided with resilient portions.

Summarizing the above description with reference to FIGS. 1 and 3, the forming method of the connector assembly 10 of the present embodiment comprises the preparation step of preparing the main connector 20, the first wiring sheet 50, the second wiring sheet 60 and the auxiliary connector 70, the main connector 20 having the receiving portion 22, the first wall 342 and the second wall 344, the first wall 342 and the second wall 344 being located opposite to each other across the receiving portion 22 in the X-direction, the first wiring sheet 50 having the first positioned portion 524, the first deformable portion 528 and the first contact 546, the first deformable portion 528 extending from the first positioned portion 524 along the Y-direction, the first contact 546 being provided on the first deformable portion 528, the second wiring sheet 60 having the second positioned portion 624, the second deformable portion 628 and the second contact 646, the second deformable portion 628 extending from the second positioned portion 624 along the Y-direction, the second contact 646 being provided on the second deformable portion 628, the auxiliary connector 70 having the received portion 78, at least one of the receiving portion 22 and the received portion 78 being provided with the resilient portion which is resiliently deformable.

Figure 13:
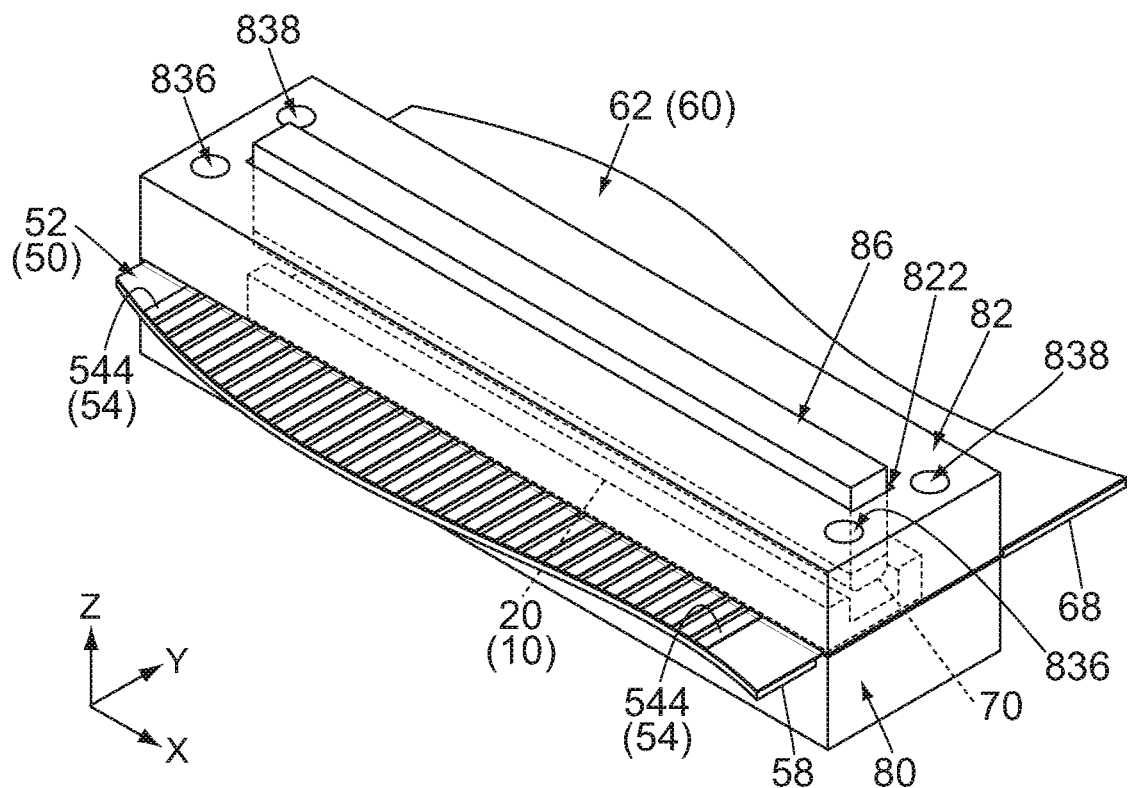
FIG. 13 is a perspective view showing the connector assembly of FIG. 1 and the jigs of FIG. 12 in an arrangement step of the forming method of FIG. 3, wherein hidden outlines of the pressing jig, the main connector and the auxiliary connector are partially illustrated with dashed line.

Referring to FIGS. 3 and 13, in the arrangement step subsequent to the preparation step, the main connector 20, the first wiring sheet 50, the second wiring sheet 60 and the auxiliary connector 70 are arranged in this order upward in the Z-direction by using a main positioning jig (positioning jig) 80 and an auxiliary positioning jig (positioning jig) 82. Hereafter, explanation will be made about the arrangement step along the arrangement order of the main positioning jig 80, the members of the connector assembly 10 and the auxiliary positioning jig 82.

Figure 12:
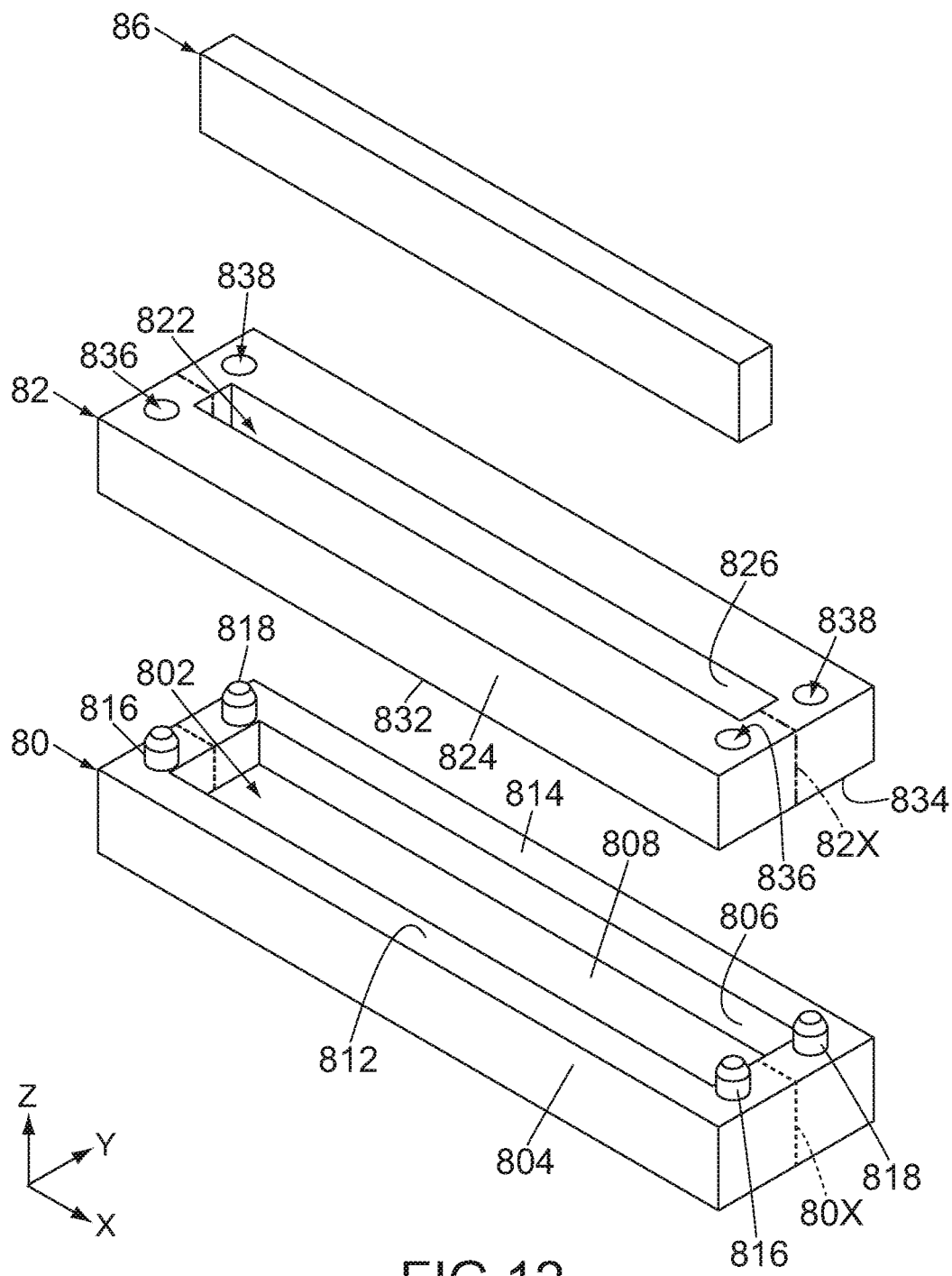
FIG. 12 is a perspective view showing jigs, namely a main positioning jig, an auxiliary positioning jig and a pressing jig, which are used when the members of the connector assembly of FIG. 1 are combined, wherein the boundary between a first block and a second block of the main positioning jig is illustrated with dashed line, and the boundary between a first wall and a second wall of the auxiliary positioning jig is illustrated with chain dotted lines.

As shown in FIG. 12, the main positioning jig 80 of the present embodiment has an accommodation portion 802, a first block 804, a second block 806 and a bottom plate 808. The bottom plate 808 has a flat-plate shape in parallel to the XY-plane. The accommodation portion 802 is a space located on the bottom plate 808 and extends along the X-direction. Each of the first block 804 and the second block 806 projects upward from the bottom plate 808. The first block 804 and the second block 806 are located at opposite sides of the main positioning jig 80 in the Y-direction, respectively, and enclose the accommodation portion 802 in the XY-plane. Thus, the first block 804 and the second block 806 are located opposite to each other across the accommodation portion 802 in the Y-direction.

The first block 804 and the second block 806 of the present embodiment are connected to each other at a boundary 80X. In the present embodiment, the boundary 80X is provided with no identifiable part such as irregularity. However, the present invention is not limited thereto. For example, the boundary 80X may be provided with recesses which are recessed downward. In this modification, the first block 804 and the second block 806 may be separated from each other by the recesses.

Figure 14:
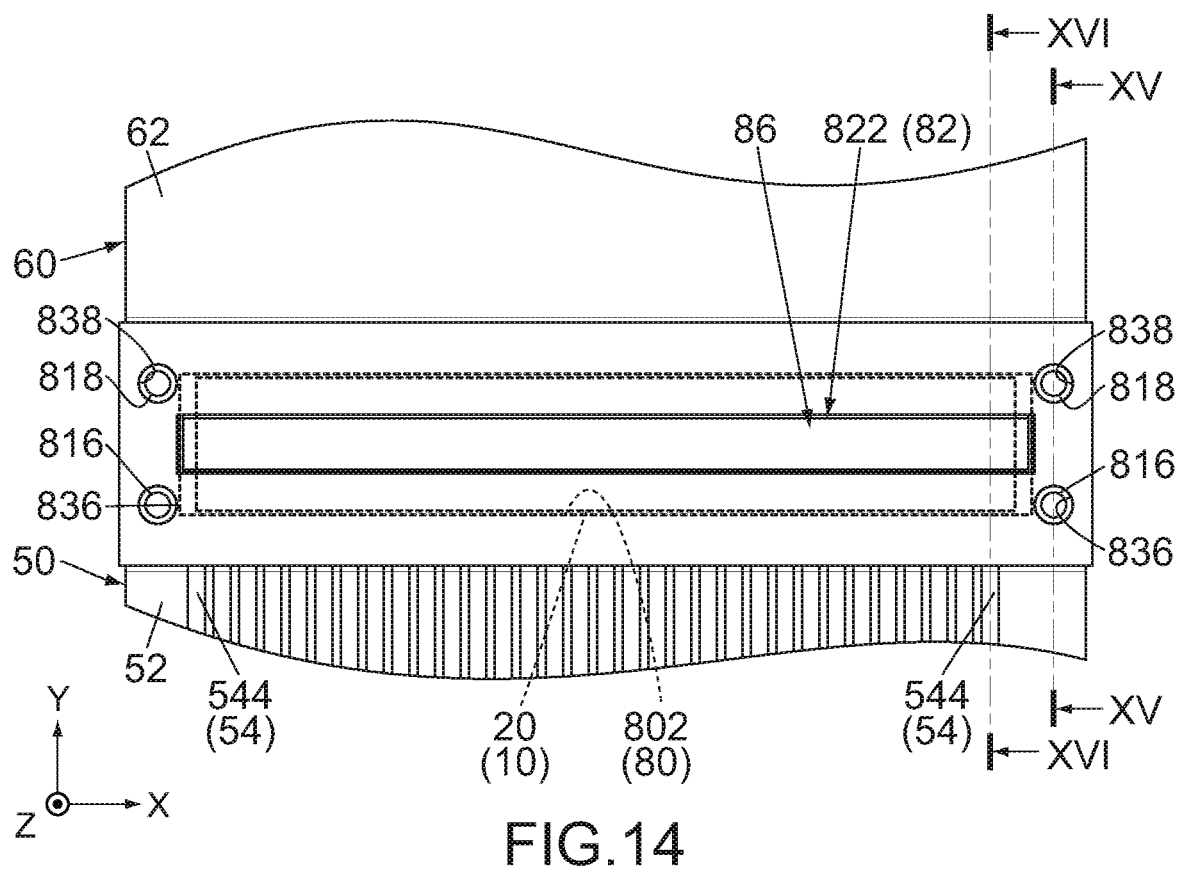
FIG. 14 is a top view showing the connector assembly and the jigs of FIG. 13, wherein a position of an accommodation portion of the main positioning jig and a position of the main connector are illustrated with dashed line.
Figure 16:
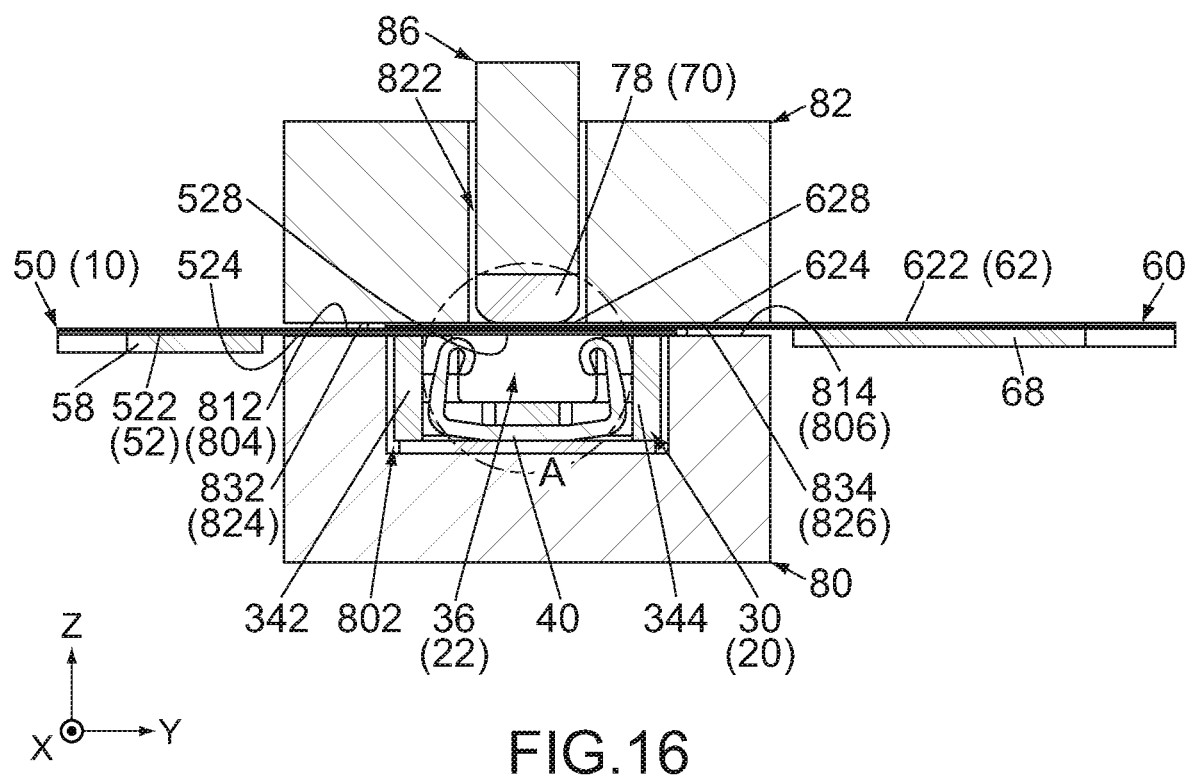
FIG. 16 is a cross-sectional view showing the connector assembly and the jigs of FIG. 14, taken along line XVI-XVI.

Referring to FIG. 12 together with FIG. 1, the accommodation portion 802 has a shape corresponding to the main connector 20. Referring to FIG. 14, a size of the accommodation portion 802 is larger than another size of the main connector 20 in the XY-plane. In particular, a size of the accommodation portion 802 is slightly larger than another size of the main connector 20 in the Y-direction. The thus-shaped main connector 20 can be accommodated in the accommodation portion 802 with regulation of a movement thereof in the Y-direction. Referring to FIG. 16, in the present embodiment, a size of the accommodation portion 802 is equal to another size of the main connector 20 in the Z-direction. The thus-shaped main connector 20 can be entirely accommodated in the accommodation portion 802. However, the present invention is not limited thereto, but the main connector 20 may be partially accommodatable in the accommodation portion 802.

In the arrangement step (see FIG. 3), the main positioning jig 80 is placed, for example, on an upper surface of a working bench (not shown) which is in parallel to the XY-plane. The thus-placed main positioning jig 80 is temporarily held so as not to be moved. Then, the main connector 20 is accommodated in the accommodation portion 802 of the main positioning jig 80, so that a movement of the main connector 20 is regulated in the Y-direction. Thus, the main connector 20 is arranged within the accommodation portion 802 so as not to be moved in the XY-plane, particularly in the Y-direction.

Referring to FIG. 12, the main positioning jig 80 has a first positioning portion 812 and a second positioning portion 814. In the present embodiment, the first block 804 is provided with the first positioning portion 812, and the second block 806 is provided with the second positioning portion 814. The first positioning portion 812 includes an upper surface of the first block 804 in parallel to the XY-plane and two first positioning projections 816 formed on the first block 804. The second positioning portion 814 includes an upper surface of the second block 806 in parallel to the XY-plane and two second positioning projections 818 formed on the second block 806. Each of the first positioning portion 812 and the second positioning portion 814 is located, at least in part, outward of the accommodation portion 802 in the Y-direction.

The two first positioning projections 816 are located in the vicinities of opposite ends of the first positioning portion 812 in the X-direction, respectively. The two second positioning projections 818 are located in the vicinities of opposite ends of the second positioning portion 814 in the X-direction, respectively. Each of the first positioning projections 816 projects upward from the first block 804 to have a cylindrical shape. Each of the second positioning projections 818 projects upward from the second block 806 to have a cylindrical shape. Thus, each of the first positioning projections 816 and the second positioning projections 818 of the present embodiment is a projection projecting upward and has a circular shape in the XY-plane.

Referring to FIGS. 1 and 12, the two first positioned holes 526 of the first wiring sheet 50 correspond to the two first positioning projections 816 of the main positioning jig 80, respectively. Each of the first positioned holes 526 has a circular shape larger than that of the corresponding first positioning projection 816 in the XY-plane. In addition, a distance between center points of the two first positioned holes 526 is equal to another distance between center points of the two first positioning projections 816 in the XY-plane. The thus-formed first wiring sheet 50 can be arranged on the main positioning jig 80 while the first positioning projections 816 are inserted into the first positioned holes 526, respectively.

Referring to FIGS. 13 to 17, in the arrangement step (see FIG. 3), the first wiring sheet 50 is arranged at the first predetermined position, or the position shown in FIGS. 13 to 17, so as to extend in parallel to the XY-plane. In detail, referring to FIGS. 15 and 17, the first wiring sheet 50 is arranged so that the first contacts 546 face upward, and then placed over the main connector 20 and the main positioning jig 80 while the first positioning projections 816 of the first positioning portion 812 of the main positioning jig 80 pass through the first positioned holes 526 of the first positioned portion 524, respectively.

Figure 15:
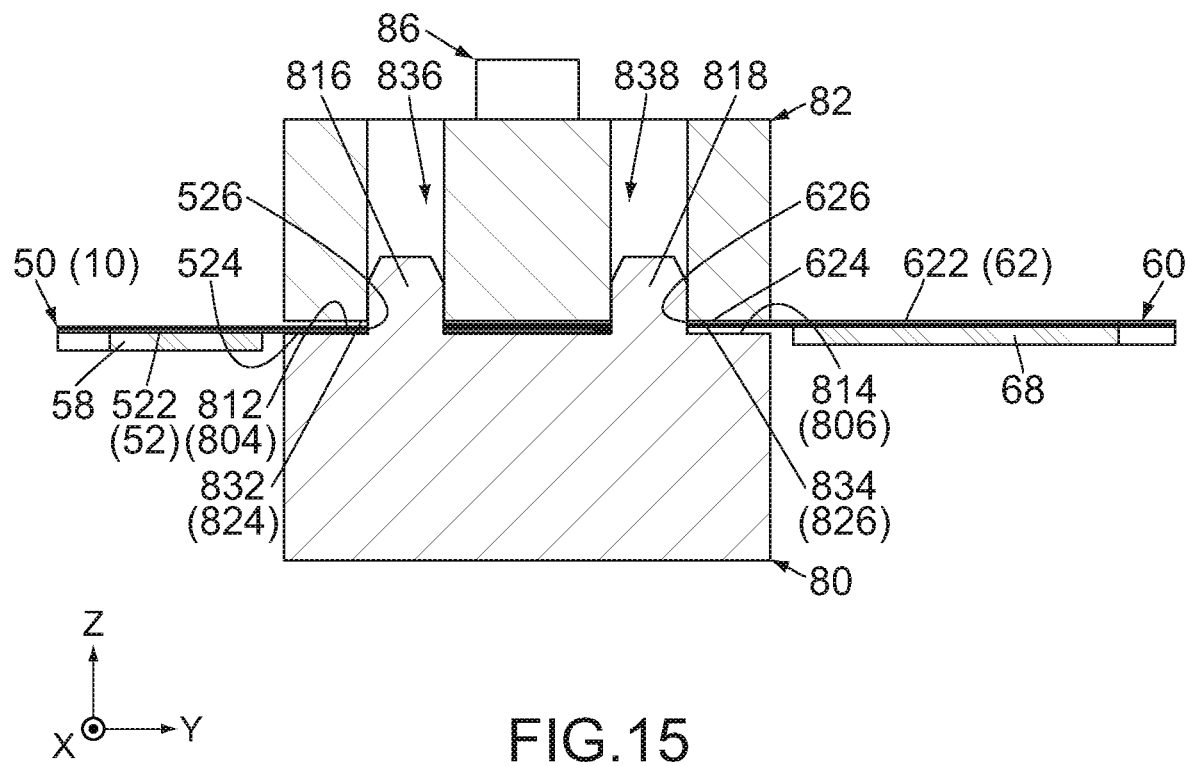
FIG. 15 is a cross-sectional view showing the connector assembly and the jigs of FIG. 14, taken along line XV-XV.
Figure 17:
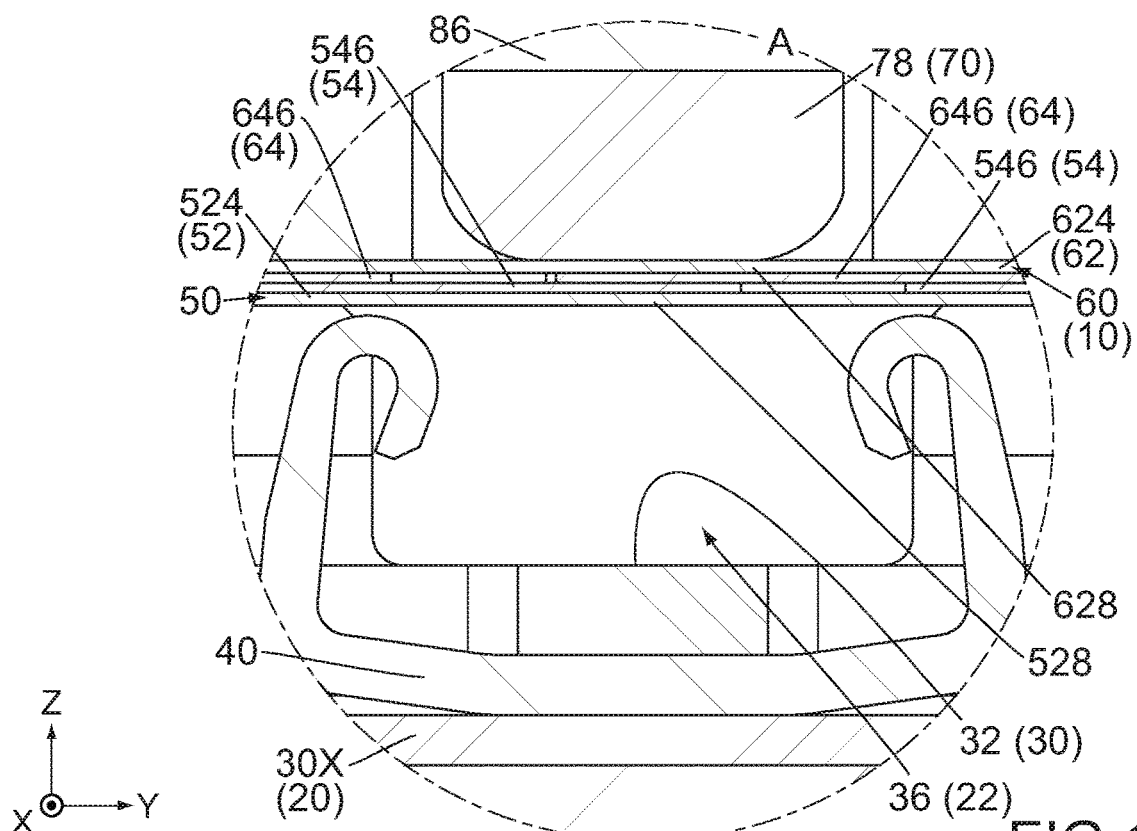
FIG. 17 is a cross-sectional view showing parts of the connector assembly and the jigs enclosed by chain dotted lines A of FIG. 16.

Referring to FIG. 15, when the first wiring sheet 50 is arranged at the first predetermined position, the first positioned portion 524 is located over the first block 804 and is positioned by the first positioning portion 812, particularly by the first positioning projections 816, so as not to be moved in the XY-plane. Referring to FIG. 17, the first deformable portion 528 is then located over the receiving portion 22, and each of the first contacts 546 is located above the corresponding resilient member 40.

Referring to FIG. 16, according to the present embodiment, when the first wiring sheet 50 is located at the first predetermined position, the first deformable portion 528 extends along the Y-direction from the upper surface of the first wall 342 of the main connector 20 to the upper surface of the second positioning portion 814 of the main positioning jig 80 while passing over the receiving portion 22. However, the present invention is not limited thereto, but the first deformable portion 528 may extend over the receiving portion 22 onto the second wall 344.

Referring to FIGS. 1 and 12, the two second positioned holes 626 of the second wiring sheet 60 correspond to the two second positioning projections 818 of the main positioning jig 80, respectively. Each of the second positioned holes 626 has a circular shape larger than that of the corresponding second positioning projection 818 in the XY-plane. In addition, a distance between center points of the two second positioned holes 626 is equal to another distance between center points of the two second positioning projections 818 in the XY-plane. The thus-formed second wiring sheet 60 can be arranged on the main positioning jig 80 while the second positioning projections 818 are inserted into the second positioned holes 626, respectively.

Referring to FIGS. 13 to 17, in the arrangement step (see FIG. 3), the second wiring sheet 60 is arranged at the second predetermined position, or the position shown in FIGS. 13 to 17, so as to extend in parallel to the XY-plane. In detail, referring to FIGS. 15 and 17, the second wiring sheet 60 is arranged so that the second contacts 646 face downward, and then placed over the main connector 20 and the main positioning jig 80 via the first wiring sheet 50 while the second positioning projections 818 of the second positioning portion 814 of the main positioning jig 80 pass through the second positioned holes 626 of the second positioned portion 624, respectively.

Referring to FIG. 15, when the second wiring sheet 60 is arranged at the second predetermined position, the second positioned portion 624 is located over the second block 806 and is positioned by the second positioning portion 814, particularly by the second positioning projections 818, so as not to be moved in the XY-plane. Referring to FIG. 17, the second deformable portion 628 is then located over the first deformable portion 528, and each of the second contacts 646 is located above the corresponding resilient member 40 and is in contact with or faces the corresponding first contact 546.

Referring to FIG. 16, according to the present embodiment, when the second wiring sheet 60 is located at the second predetermined position, the second deformable portion 628 is located on the first deformable portion 528 and extends along the Y-direction from the upper surface of the second wall 344 of the main connector 20 to the upper surface of the first positioning portion 812 of the main positioning jig 80 while passing over the receiving portion 22. However, the present invention is not limited thereto, but the second deformable portion 628 may be located on the first deformable portion 528 to extend over the receiving portion 22 onto the first wall 342.

Referring to FIG. 16, the received portion 78 of the auxiliary connector 70 is arranged on the second deformable portion 628 of the second wiring sheet 60 in the arrangement step (see FIG. 3). The thus-arranged received portion 78 is located right above the receiving portion 22 via the first deformable portion 528 and the second deformable portion 628.

Summarizing the above description with reference to FIGS. 15 to 17, the forming method of the connector assembly 10 according to the present embodiment comprises the arrangement step (see FIG. 3) of arranging the main connector 20, the first wiring sheet 50, the second wiring sheet 60 and the auxiliary connector 70 by using the positioning jig 80 so that the main connector 20, the first wiring sheet 50, the second wiring sheet 60 and the auxiliary connector 70 are arranged in this order upward in the Z-direction, the positioning jig 80 having the accommodation portion 802, the first positioning portion 812 and the second positioning portion 814, the accommodation portion 802 being capable of accommodating the main connector 20 with regulation of a movement of the main connector 20 in the Y-direction, each of the first positioning portion 812 and the second positioning portion 814 being located, at least in part, outward of the accommodation portion 802 in the Y-direction, the main connector 20 being accommodated in the accommodation portion 802, the first contact 546 being arranged to face upward, the first positioned portion 524 being positioned by the first positioning portion 812, the first deformable portion 528 being located to extend over the receiving portion 22 onto the second wall 344, the second contact 646 being arranged to face downward, the second positioned portion 624 being positioned by the second positioning portion 814, the second deformable portion 628 being located on the first deformable portion 528 to extend over the receiving portion 22 onto the first wall 342, the received portion 78 being located on the receiving portion 22 via the first deformable portion 528 and the second deformable portion 628.

Referring to FIG. 12, according to the arrangement step (see FIG. 3) of the present embodiment, the auxiliary positioning jig 82 is used in addition to the main positioning jig 80.

As shown in FIG. 12, the auxiliary positioning jig 82 of the present embodiment has an auxiliary accommodation portion 822, a first wall 824 and a second wall 826. The auxiliary accommodation portion 822 is a space passing through the auxiliary positioning jig 82 in the Z-direction and extends along the X-direction. The first wall 824 and the second wall 826 are located at opposite sides of the auxiliary positioning jig 82 in the Y-direction, respectively, and enclose the auxiliary accommodation portion 822 in the XY-plane. Thus, the first wall 824 and the second wall 826 are located opposite to each other across the auxiliary accommodation portion 822 in the Y-direction.

The first wall 824 and the second wall 826 of the present embodiment are connected to each other at a boundary 82X. In the present embodiment, the boundary 82X is provided with no identifiable part such as irregularity. However, the present invention is not limited thereto. For example, the boundary 82X may be provided with recesses which are recessed upward. In this modification, the first wall 824 and the second wall 826 may be separated from each other by the recesses.

Referring to FIG. 12 together with FIG. 1, the auxiliary accommodation portion 822 has a shape corresponding to the auxiliary connector 70. Referring to FIG. 13, a size of the auxiliary accommodation portion 822 is larger than another size of the auxiliary connector 70 in the XY-plane. In particular, a size of the auxiliary accommodation portion 822 is slightly larger than another size of the auxiliary connector 70 in each of the X-direction and the Y-direction. In addition, a size of the auxiliary accommodation portion 822 is larger than another size of the auxiliary connector 70 in the Z-direction.

The auxiliary connector 70 shaped as describe above can be entirely accommodated in the auxiliary accommodation portion 822 while a movement of the auxiliary connector 70 is regulated in the XY-plane but is allowed in the Z-direction. However, the present invention is not limited thereto. For example, the auxiliary connector 70 may be partially accommodatable in the auxiliary accommodation portion 822. The auxiliary accommodation portion 822 may be modified, provided that the auxiliary accommodation portion 822 is capable of accommodating the received portion 78 of the auxiliary connector 70 with allowance of a movement of the auxiliary connector 70 in the Z-direction.

Referring to FIG. 12, the auxiliary positioning jig 82 has a first positioning portion 832 and a second positioning portion 834. In the present embodiment, the first wall 824 is provided with the first positioning portion 832, and the second wall 826 is provided with the second positioning portion 834. The first positioning portion 832 includes a lower surface of the first wall 824 in parallel to the XY-plane and two first positioning holes 836 formed in the first wall 824. The second positioning portion 834 includes a lower surface of the second wall 826 in parallel to the XY-plane and two second positioning holes 838 formed in the second wall 826. Each of the first positioning portion 832 and the second positioning portion 834 is located, at least in part, outward of the auxiliary accommodation portion 822 in the Y-direction.

The two first positioning holes 836 are located in the vicinities of opposite ends of the first positioning portion 832 in the X-direction, respectively. The two second positioning holes 838 are located in the vicinities of opposite ends of the second positioning portion 834 in the X-direction, respectively. Each of the first positioning holes 836 is a cylindrical hole passing through the first wall 824 in the Z-direction and has a circular shape in the XY-plane. Each of the second positioning holes 838 is a cylindrical hole passing through the second wall 826 in the Z-direction and has a circular shape in the XY-plane.

Referring to FIG. 14, the two first positioning holes 836 of the auxiliary positioning jig 82 are provided so as to correspond to the two first positioning projections 816 of the main positioning jig 80, respectively, and the two second positioning holes 838 of the auxiliary positioning jig 82 are provided so as to correspond to the two second positioning projections 818 of the main positioning jig 80, respectively. Each of the first positioning holes 836 has a size larger than that of the corresponding first positioning projection 816 in the XY-plane. Each of the second positioning holes 838 has a size larger than that of the corresponding second positioning projection 818 in the XY-plane. In addition, in the XY-plane, a positional relation among center points of the two first positioning holes 836 and the two second positioning holes 838 is identical to another positional relation among the center points of the two first positioning projections 816 and the two second positioning projections 818.

Referring to FIG. 15, according to the aforementioned structure, the main positioning jig 80 and the auxiliary positioning jig 82 can be combined to each other while the first positioning projections 816 and the second positioning projections 818 are inserted into the first positioning holes 836 and the second positioning holes 838, respectively. When the main positioning jig 80 and the auxiliary positioning jig 82 are combined to each other after arrangement of the first wiring sheet 50 and the second wiring sheet 60 on the main positioning jig 80, the first positioned portion 524 of the first wiring sheet 50 is sandwiched between the first positioning portion 812 of the main positioning jig 80 and the first positioning portion 832 of the auxiliary positioning jig 82 in the Z-direction, and the second positioned portion 624 of the second wiring sheet 60 is sandwiched between the second positioning portion 814 of the main positioning jig 80 and the second positioning portion 834 of the auxiliary positioning jig 82 in the Z-direction. As a result, the first positioned portion 524 and the second positioned portion 624 are further securely positioned in the XY-plane.

Referring to FIG. 16, in the arrangement step (see FIG. 3) of the present embodiment, the auxiliary connector 70 is accommodated in the auxiliary accommodation portion 822 of the auxiliary positioning jig 82 after attachment of the auxiliary positioning jig 82 to the main positioning jig 80, so that a movement of the auxiliary connector 70 in the XY-plane is regulated. Thus, the auxiliary connector 70 is arranged to be unmovable in the XY-plane but to be movable in the Z-direction.

Summarizing the above description with reference to FIGS. 15 and 16, the positioning jig of the present embodiment includes the main positioning jig 80 and the auxiliary positioning jig 82 which are separable from each other. Each of the first positioning portion and the second positioning portion is provided on both the main positioning jig 80 and the auxiliary positioning jig 82. Moreover, according to the arrangement step (see FIG. 3) of the present embodiment, the main positioning jig 80 and the auxiliary positioning jig 82 are combined to each other so as to sandwich the first wiring sheet 50 and the second wiring sheet 60 therebetween in the Z-direction, and the received portion 78 of the auxiliary connector 70 is accommodated in the auxiliary accommodation portion 822.

Referring to FIG. 12, the positioning jig according to the present invention is not limited to that of the present embodiment. For example, the auxiliary positioning jig 82 may be provided as necessary. When the auxiliary positioning jig 82 is not provided, the first positioning portion and the second positioning portion may be provided only on the main positioning jig 80. Thus, each of the first positioning portion and the second positioning portion may be provided on at least one of the main positioning jig 80 and the auxiliary positioning jig 82. In another modification of the present embodiment, the first wall 824 and the second wall 826 of the auxiliary positioning jig 82 may have lower surfaces provided with first positioning projections and second positioning projections, and the main positioning jig 80 may be provided with first positioning holes and second positioning holes.

The shape of each of the first positioning projections 816 and the second positioning projections 818 is not limited to a circular shape in the XY-plane. The size of each of the first positioning projections 816 may be same as or different from the size of each of the second positioning projections 818 in the XY-plane. The number and the arrangement of the first positioning projections 816 are not limited to those of the present embodiment. The number and the arrangement of the second positioning projections 818 are not limited to those of the present embodiment. For example, the main positioning jig 80 may have only one of the first positioning projections 816 and only one of the second positioning projections 818.

Each of the first positioning holes 836 may have a shape and size which allows the corresponding first positioning projection 816 to be received therein. Each of the second positioning holes 838 may have a shape and size which allows the corresponding second positioning projection 818 to be received therein. The first positioning holes 836 may be arranged so that the first positioning projections 816 are received therein, respectively. The second positioning holes 838 may be arranged so that the second positioning projections 818 are received therein, respectively.

Referring to FIG. 1 together with FIG. 15, each of the first positioned holes 526 of the first wiring sheet 50 may have a shape and size which allows the corresponding first positioning projection 816 to pass therethrough. Each of the second positioned holes 626 of the second wiring sheet 60 may have a shape and size which allows the corresponding second positioning projection 818 to pass therethrough. The first positioned holes 526 may be arranged so that the first positioning projections 816 pass therethrough, respectively. The second positioned holes 626 may be arranged so that the second positioning projections 818 pass therethrough, respectively.

Referring to FIG. 12 together with FIG. 15, the first positioning holes 836 and the second positioning holes 838 of the auxiliary positioning jig 82 may be provided as necessary. In the arrangement step (see FIG. 3) according to a structure in which the first positioning holes 836 and the second positioning holes 838 are not provided, upper ends of the first positioning projections 816 and the second positioning projections 818 may pass through the first positioned holes 526 and the second positioned holes 626 to be pressed against lower surfaces of the auxiliary positioning jig 82, or pressed against the first positioning portion 832 and the second positioning portion 834.

The first positioning projections 816 and the second positioning projections 818 may be provided as necessary. If the first positioning projections 816 and the second positioning projections 818 are not provided, the arrangement step (see FIG. 3) may be modified so that the first positioned portion 524 is sandwiched between the first positioning portion 812 and the first positioning portion 832 to be positioned by pressure, and that the second positioned portion 624 is sandwiched between the second positioning portion 814 and the second positioning portion 834 to be positioned by pressure.

Referring to FIG. 16, in the arrangement step (see FIG. 3) according to the present embodiment, the first positioned portion 524 is sandwiched between the upper surface of the first wall 342 of the main connector 20 and the first positioning portion 832 together with an end of the second deformable portion 628, and the second positioned portion 624 is sandwiched between the upper surface of the second wall 344 of the main connector 20 and the second positioning portion 834 together with an end of the first deformable portion 528. This arrangement also helps to position the first positioned portion 524 and the second positioned portion 624. Thus, according to the present embodiment, the upper surface of the first wall 342 and the upper surface of the second wall 344 work as positioning portions. However, the present invention is not limited thereto. For example, the upper surface of the first wall 342 and the upper surface of the second wall 344 may be located below the first positioning portion 812 and the second positioning portion 814 even if they do not work as positioning portions.

Referring to FIGS. 1, 3 and 17, the arrangement step of the present embodiment provides a plurality of sets which include the resilient members 40, respectively. Each set includes one of the resilient members 40, two of the first contacts 546 corresponding to this resilient member 40, a part of the first deformable portion 528 formed with these two first contacts 546, two of the second contacts 646 corresponding to this resilient member 40 and a part of the second deformable portion 628 formed with these two second contacts 646. According to the present embodiment, in the pressing step subsequent to the arrangement step, a downward movement of the auxiliary connector 70 causes deformation of the first deformable portion 528 and the second deformable portion 628 of each of the sets, so that the connector assembly 10 is obtained. Hereafter, explanation will be made about the pressing step with reference to one of the sets formed in the arrangement step. The explanation described below is applicable to each of the sets.

Figure 18:
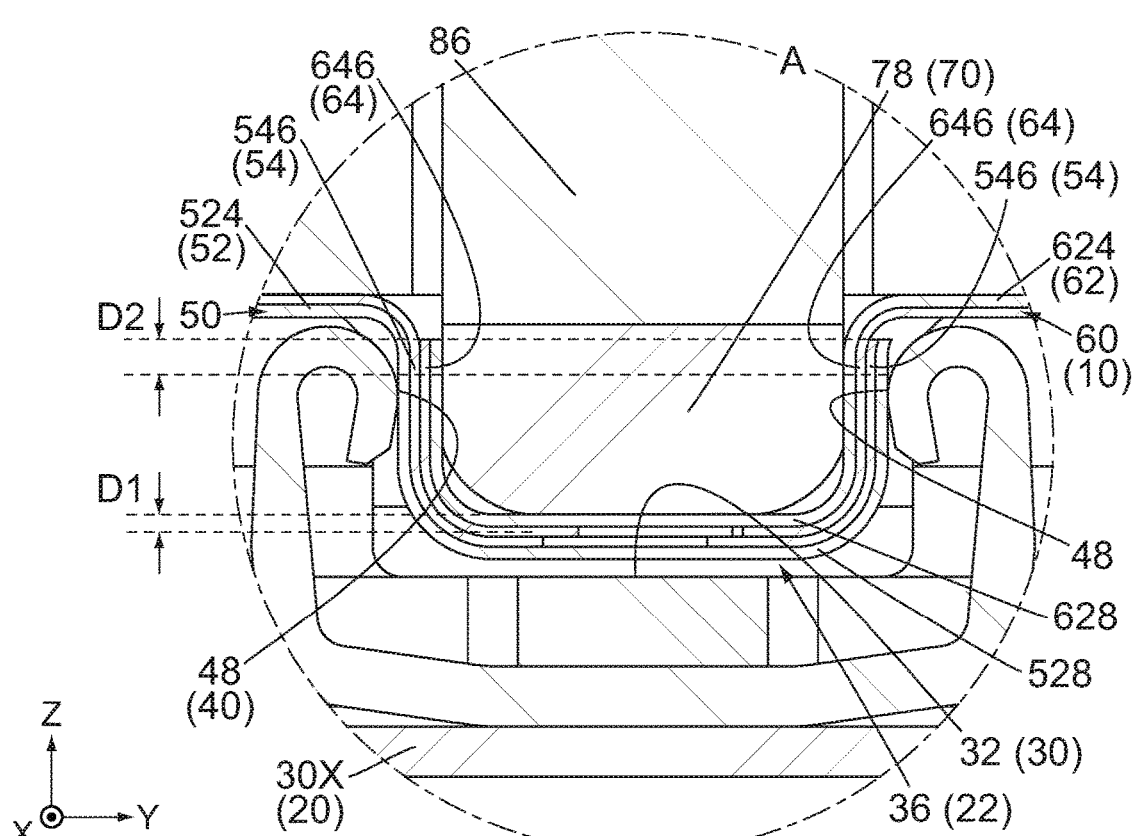
FIG. 18 is another cross-sectional view showing parts of the connector assembly and the jigs enclosed by chain dotted lines A of FIG. 16, wherein the connector assembly and the jigs are in a pressing step of the forming method of FIG. 3.

Referring to FIGS. 17 and 18, the auxiliary connector 70 is moved downward subsequent to the arrangement step (see FIG. 3). When the auxiliary connector 70 is moved downward, the received portion 78 of the auxiliary connector 70 pushes down the first deformable portion 528 of the first wiring sheet 50 and the second deformable portion 628 of the second wiring sheet 60. Meanwhile, the first positioned portion 524 of the first wiring sheet 50 is positioned so as not to be moved relative to the main connector 20. Similarly, the second positioned portion 624 of the second wiring sheet 60 is positioned so as not to be moved relative to the main connector 20.

Since the positions of the first positioned portion 524 and the second positioned portion 624 are fixed relative to the main connector 20 as described above, the first deformable portion 528 and the second deformable portion 628 pushed by the received portion 78 start to be deformed along the received portion 78 in the YZ-plane. When the auxiliary connector 70 is further moved downward, the first deformable portion 528 and the second deformable portion 628 are sandwiched between the two projecting portions 48 in the Y-direction together with the received portion 78 to be pressed against opposite sides of the received portion 78 in the Y-direction. The first deformable portion 528 and the second deformable portion 628 are pushed into the receiving portion 22 of the main connector 20 together with the received portion 78 while being deformed as described above. As a result, the two projecting portions 48 of the resilient member 40 sandwiches and presses the first contacts 546, the second contacts 646 and the received portion 78 in the Y-direction, so that each of the first contacts 546 is pressed against the corresponding second contact 646 by a resilient force of the resilient member 40.

When the downward movement of the auxiliary connector 70 is further continued, the connector assembly 10 changes its state from the state shown in FIG. 17 to the state shown in FIG. 18. During this change of state, each of the two first contacts 546 is deformed while being pressed and rubbed against the corresponding second contact 646.

In detail, referring to FIG. 18, as the received portion 78 is moved downward by a distance D1, one of the two first contacts 546, or the positive Y-side first contact 546 in FIG. 18, is moved downward relative to the corresponding second contact 646 by a distance D2 that is two times the distance D1. Meanwhile, one of the two second contacts 646, or the negative Y-side second contact 646 in FIG. 18, is moved downward relative to the corresponding first contact 546 by the distance D2. As a result, the first contact 546 and the second contact 646 corresponding to each other are rubbed against each other. This rubbing removes foreign substances such as contaminations attached to the first contact 546 and the second contact 646 and oxide films formed on the first contact 546 and the second contact 646. In other words, each of the first contact 546 and the second contact 646 is wiped.

Figure 19:
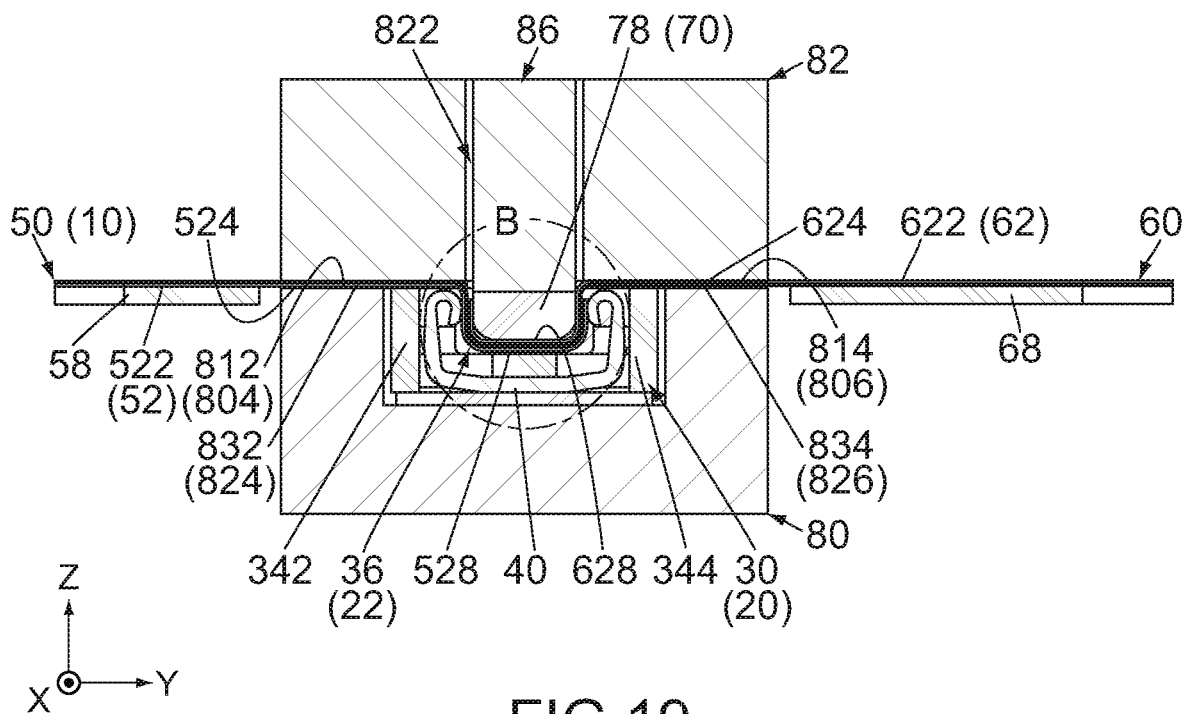
FIG. 19 is a cross-sectional view showing the connector assembly and the jigs of FIG. 16 at the end of the pressing step of the forming method of FIG. 3.
Figure 20:
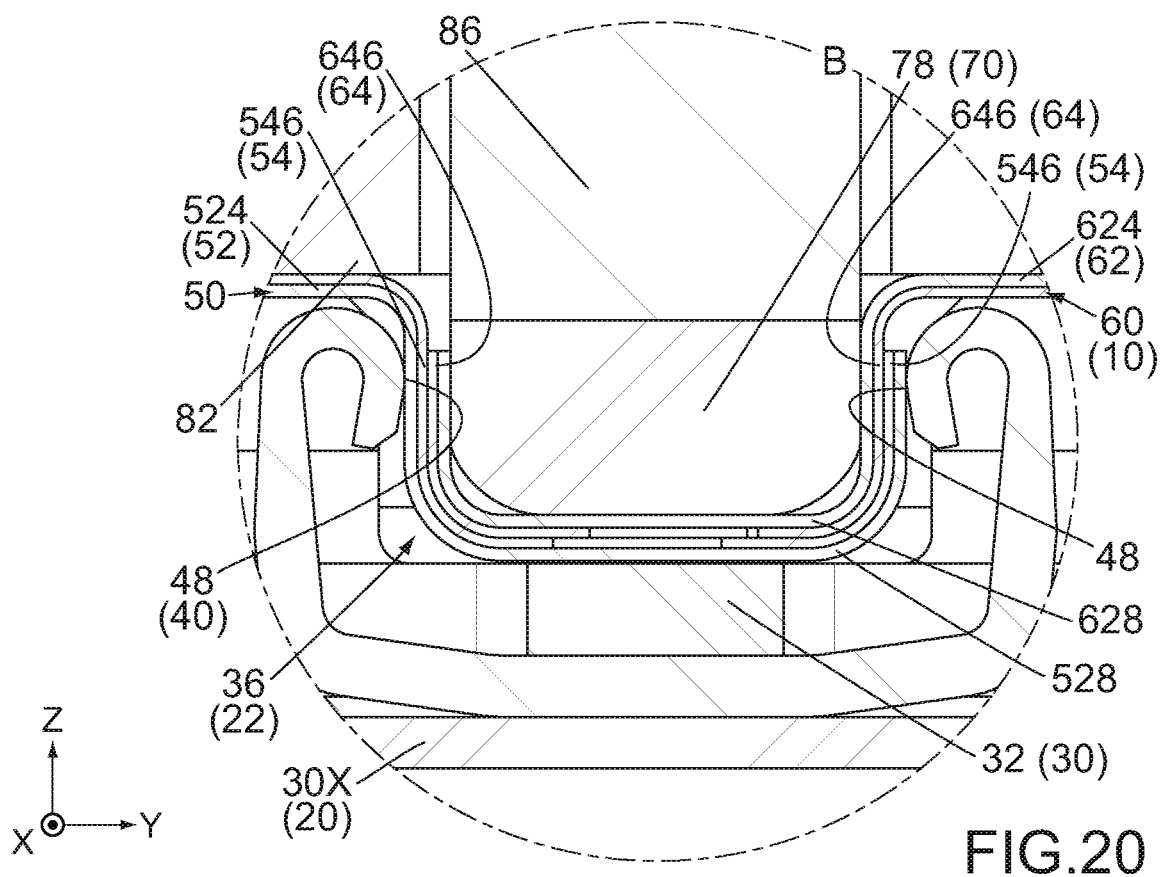
FIG. 20 is a cross-sectional view showing parts of the connector assembly and the jigs enclosed by chain dotted lines B of FIG. 19.

Referring to FIGS. 19 and 20, when the downward movement of the auxiliary connector 70 is further continued, the first deformable portion 528 and the second deformable portion 628 are further deformed to be pushed into the receiving portion 22 of the main connector 20 together with the received portion 78. During the state change of the connector assembly 10 from the state shown in FIGS. 16 and 17 to the state in which the pressing step (see FIG. 3) is ended as shown in FIGS. 19 and 20, each of the two first contacts 546 is pressed and rubbed against the corresponding second contact 646 to be deformed, so that the foreign substances are removed.

Summarizing the above description, the forming method of the connector assembly 10 according to the present embodiment comprises the pressing step (see FIG. 3) of moving the auxiliary connector 70 downward to press the first deformable portion 528 and the second deformable portion 628 downward by the received portion 78 so that the first deformable portion 528 and the second deformable portion 628 are deformed and pushed into the receiving portion 22.

Referring to FIG. 20, when the pressing step (see FIG. 3) is ended, the first contact 546 and the second contact 646 are located within the receiving portion 22 to be in contact with each other. As a result, the first conductive patterns 54 of the first wiring sheet 50 are connected to the second conductive patterns 64 of the second wiring sheet 60, and the first wiring sheet 50 is electrically connected with the second wiring sheet 60. Meanwhile, the two projecting portions 48 of the resilient member 40 sandwich and press the first contacts 546, the second contacts 646 and the received portion 78 therebetween in the Y-direction, so that each of the first contacts 546 is pressed against the corresponding second contact 646. Thus, the resilient member 40 of the present embodiment works as the resilient portion which presses the first contact 546 against the second contact 646 by a resilient force. In other words, the resilient portion 40 applies the resilient force that keeps the first contact 546 and the second contact 646 in contact with each other.

Referring to FIG. 15, as described above, as a result of the arrangement step (see FIG. 3) according to the present embodiment, the first positioning portion 812 (first positioning portion 832) and the second positioning portion 814 (second positioning portion 834), which are located opposite to each other in the Y-direction, position the first positioned portion 524 and the second positioned portion 624, respectively. Referring to FIG. 17, as a result of the arrangement step, the first deformable portion 528 which extends from the first positioned portion 524 and the second deformable portion 628 which extends from the second positioned portion 624 are located over the receiving portion 22 under a state where the first contact 546 provided on the first deformable portion 528 faces upward and the second contact 646 provided on the second deformable portion 628 faces downward.

Referring to FIG. 18, when the first deformable portion 528 and the second deformable portion 628 arranged as described above are pressed downward in the pressing step (see FIG. 3), the first deformable portion 528 and the second deformable portion 628 are deformed so that the first contact 546 and the second contact 646 are rubbed against each other. This rubbing makes the first contact 546 and the second contact 646 clean by the end of the pressing step. Thus, the present embodiment provides the connector assembly 10 comprising the first wiring sheet 50 and the second wiring sheet 60 which make good electrical connection with each other with no additional cleaning step in manufacture.

Referring to FIG. 20, the present embodiment provides, for each of the resilient members 40, the two first contacts 546 corresponding to the two projecting portions 48, respectively, and the two second contacts 646 corresponding to the two projecting portions 48, respectively. According to this structure, each of the resilient members 40 can be used to simultaneously clean up the two first contacts 546 and the two second contacts 646. However, the present invention is not limited thereto. For example, each of the resilient members 40 may correspond to only one of the first contacts 546 and only one of the second contacts 646. More specifically, each of the first contacts 546 and the second contacts 646 may extend over the two projecting portions 48 in the Y-direction.

Referring to FIG. 1, each of the resilient members 40 may have four or more of the projecting portions 48, for example. More specifically, two of the resilient members 40 adjacent to each other in the X-direction may be coupled to each other by a coupling portion (not shown). Thus, each of the resilient members 40 may have at least two of the projecting portions 48. The at least two projecting portions 48 may be located, at least in part, within the recessed portion 36 and may face each other in the Y-direction.

Referring to FIGS. 3 and 16, the forming method of the connector assembly 10 of the present embodiment comprises the movement step of moving a pressing jig 86 downward. Referring to FIG. 12, the pressing jig 86 has a rectangular parallelepiped shape corresponding to the auxiliary accommodation portion 822 of the auxiliary positioning jig 82 and extends along the X-direction.

Referring to FIG. 16, in the arrangement step (see FIG. 3) according to the present embodiment, the pressing jig 86 is inserted into the auxiliary accommodation portion 822 to be arranged on the auxiliary connector 70. In the movement step (see FIG. 3), the pressing jig 86 is moved downward. In the pressing step (see FIG. 3), the downward-moved pressing jig 86 presses and moves the auxiliary connector 70 downward. Thus, the pressing step of the present embodiment is a part of the movement step and is performed in accordance with the movement step. In other words, the pressing step is performed simultaneously with the movement step. However, the present invention is not limited thereto. For example, the movement step may comprise a pre-pressing step (not shown) and the pressing step. In this modification, in the pre-movement step after the end of the arrangement step, the pressing jig 86 may be moved downward to be inserted into the auxiliary accommodation portion 822 and arranged on the auxiliary connector 70. Instead, the pressing step may be performed without using the pressing jig 86. Thus, the forming method of the connector assembly 10 does not need to comprise the movement step.

Referring to FIGS. 19 and 20, assembling of the connector assembly 10 is completed when the pressing step (see FIG. 3) is ended. The connector assembly 10 shown in FIGS. 2 and 21 can be obtained only by detaching the auxiliary positioning jig 82 from the main positioning jig 80 together with the pressing jig 86 and taking out the connector assembly 10 from the main positioning jig 80.

Figure 21:
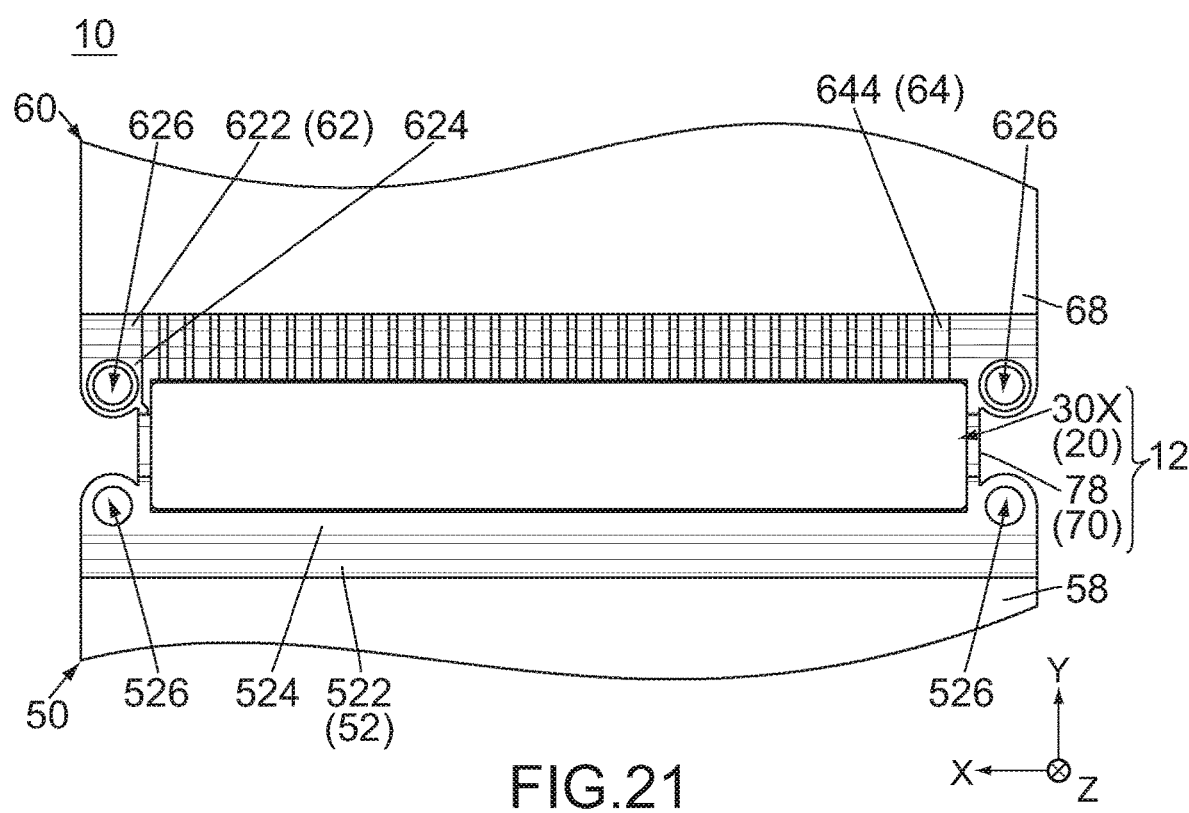
FIG. 21 is a bottom view showing the connector assembly of FIG. 2.

Referring to FIGS. 2 and 21, the main connector 20, the first wiring sheet 50, the second wiring sheet 60 and the auxiliary connector 70 of the connector assembly 10 are arranged in this order upward in the Z-direction. Each of the first positioned portion 524 and the second positioned portion 624 is located, at least in part, outward of the main connector 20 in the Y-direction. In particular, each of the first positioned holes 526 and the second positioned holes 626 is located outward of the main connector 20 in the XY-plane. Thus, the connector assembly 10 has four holes whose function seems to be unknown.

Referring to FIG. 2, in the connector assembly 10, the received portion 78 is received in the receiving portion 22 and presses the first deformable portion 528 and the second deformable portion 628. Each of the first contacts 546 and the corresponding second contact 646 are located within the receiving portion 22 to be in contact with each other. Each of the resilient portions 40 (see FIG. 20) applies a resilient force that keeps the first contact 546 and the second contact 646 in contact with each other. According to the present embodiment, the received portion 78 is sandwiched between and pressed by the two projecting portions 48 (see FIG. 20) of each of the resilient members 40 in the Y-direction via the first deformable portion 528 and the second deformable portion 628. Thus, each of the resilient members 40 provided to the receiving portion 22 works as the resilient portion. In other words, the receiving portion 22 is provided with the resilient portions 40 each of which is resiliently deformable. However, as previously described, the present invention is not limited thereto but may be modified, provided that at least one of the receiving portion 22 and the received portion 78 is provided with a resilient portion which is resiliently deformable.

Referring to FIG. 20, each of the resilient members 40 of the present embodiment is a spring made of metal that is capable of securely sandwiching and holding the received portion 78, the first deformable portion 528 and the second deformable portion 628. However, each of the resilient members 40 may be formed of various materials and may have various shapes as necessary.

Referring to FIG. 2, according to the present embodiment, the auxiliary connector 70 does not protrude outward beyond the receiving portion 22 of the main connector 20 in the Y-direction, but the auxiliary connector 70 is entirely accommodated in the receiving portion 22 in the Y-direction. In other words, the auxiliary connector 70 is entirely located between opposite edges 22E of the receiving portion 22 in the Y-direction. In addition, the auxiliary connector 70 does not project upward beyond the receiving portion 22, but the auxiliary connector 70 is entirely located within the receiving portion 22. According to this structure, the auxiliary connector 70 is hard to be removed from the main connector 20. In other words, the auxiliary connector 70 is securely attached to the main connector 20. However, the present invention is not limited thereto, but the auxiliary connector 70 may be partially located outside the receiving portion 22.

Referring to FIGS. 2 and 21, the connector assembly 10 of the present embodiment includes a connector pair 12 which comprises the main connector 20 and the auxiliary connector 70. According to the connector pair 12 of the present embodiment, the receiving portion 22 of the main connector 20 is capable of receiving the received portion 78 of the auxiliary connector 70.

Referring to FIG. 1, in the connector pair 12, the auxiliary connector 70 is entirely located between the opposite edges 22E of the receiving portion 22 of the main connector 20 in the Y-direction when the receiving portion 22 receives the received portion 78. In particular, the auxiliary connector 70 is entirely located within the receiving portion 22 when the receiving portion 22 receives the received portion 78. Moreover, the received portion 78 is located between the two projecting portions 48 of each of the resilient members 40 in the Y-direction when the receiving portion 22 receives the received portion 78. The thus-located received portion 78 may be sandwiched between and pressed by the two projecting portions 48 in the Y-direction. Instead, the received portion 78 may be located between the two projecting portions 48 in the Y-direction while being apart from each of the two projecting portions 48 with a gap. The gap may be smaller than a thickness of the first wiring sheet 50, or the size of the first wiring sheet 50 of FIG. 1 in the Z-direction, and may be smaller than a thickness of the second wiring sheet 60, or the size of the second wiring sheet 60 of FIG. 1 in the Z-direction.

According to the aforementioned structure, the connector pair 12 enables electrical connection between the first wiring sheet 50 and the second wiring sheet 60. Each of the main connector 20 and the auxiliary connector 70 of the connector pair 12 has the already described various parts. However, the present invention is not limited thereto, but the connector pair 12 may be modified, provided that the connector pair 12 comprises two connectors which work as the main connector 20 and the auxiliary connector 70, respectively.

Referring to FIGS. 1 and 12, the connector assembly 10 of the present embodiment can be further variously modified in addition to the already described modifications.

Figure 22:
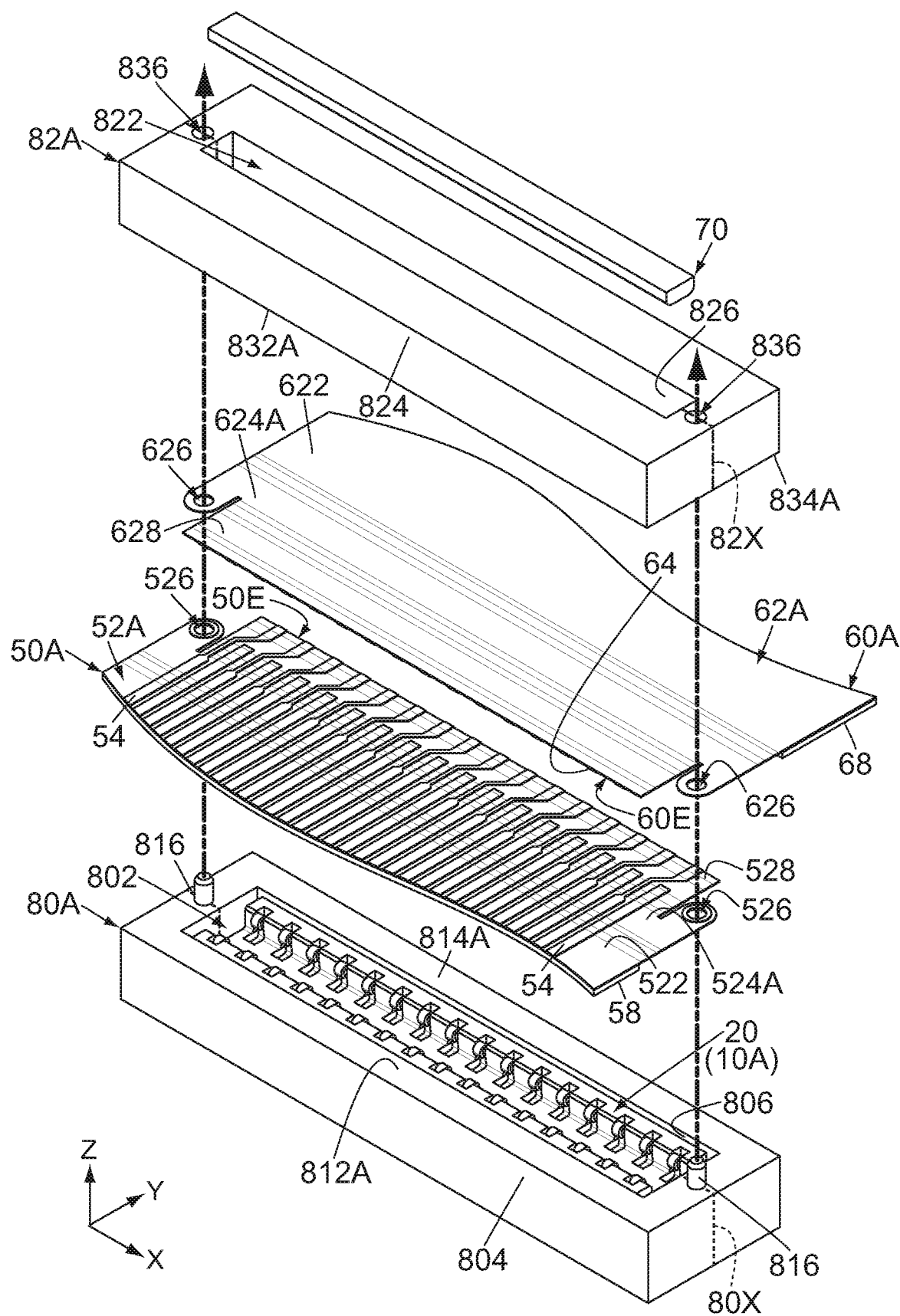
FIG. 22 is a perspective view showing a modification of the connector assembly of FIG. 1 together with modifications of the jigs, wherein the boundary between a first block and a second block of a main positioning jig is illustrated with dashed line, and the boundary between a first wall and a second wall of an auxiliary positioning jig is illustrated with chain dotted lines.
Figure 23:
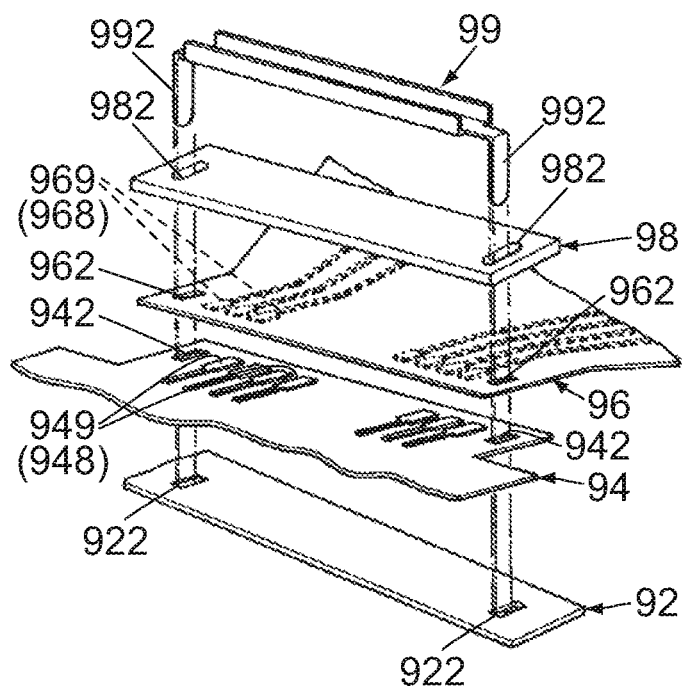
FIG. 23 is an exploded, perspective view showing a connector assembly of Patent Document 1.

For example, comparing FIG. 22 with FIG. 1, a connector assembly 10A according to a modification comprises the main connector 20 and the auxiliary connector 70 same as those of the connector assembly 10 while comprising a first wiring sheet 50A and a second wiring sheet 60A different from the first wiring sheet 50 and the second wiring sheet 60 of the connector assembly 10. The first wiring sheet 50A comprises a first insulation sheet 52A different from the first insulation sheet 52 of the first wiring sheet 50. The second wiring sheet 60A comprises a second insulation sheet 62A different from the second insulation sheet 62 of the second wiring sheet 60. The first insulation sheet 52A has a first positioned portion 524A different from the first positioned portion 524 of the first insulation sheet 52. The second insulation sheet 62A has a second positioned portion 624A different from the second positioned portion 624 of the second insulation sheet 62.

More specifically, the first positioned portion 524A has opposite end portions in the X-direction each of which protrudes outward in the X-direction and then extends toward the first end 50E along the Y-direction with a gap located between the first deformable portion 528 and this end portion in the X-direction. Each of the first positioned holes 526 is located at an end of the first positioned portion 524A in each of the X-direction and the Y-direction and is adjacent to the first deformable portion 528 in the X-direction. The second positioned portion 624A has opposite end portions in the X-direction each of which protrudes outward in the X-direction and then extends toward the second end 60E along the Y-direction with a gap located between the second deformable portion 628 and this end portion in the X-direction. Each of the second positioned holes 626 is located at an end of the second positioned portion 624A in each of the X-direction and the Y-direction and is adjacent to the second deformable portion 628 in the X-direction.

The connector assembly 10A has the structure same as that of the connector assembly 10 except the aforementioned difference. Comparing FIG. 22 with FIG. 12, the connector assembly 10A can be assembled by using a main positioning jig (positioning jig) 80A different from the main positioning jig 80, an auxiliary positioning jig (positioning jig) 82A different from the auxiliary positioning jig 82 and the pressing jig 86 same as that of the aforementioned embodiment.

The main positioning jig 80A has a first positioning portion 812A and a second positioning portion 814A different from the first positioning portion 812 and the second positioning portion 814 of the main positioning jig 80, respectively. Moreover, the main positioning jig 80A has the two first positioning projections 816 but does not have the second positioning projections 818. Each of the first positioning projections 816 is located on the boundary 80X between the first block 804 and the second block 806. In other words, the first positioning portion 812A and the second positioning portion 814A share the first positioning projections 816. The main positioning jig 80A has the structure same as that of the main positioning jig 80 except the aforementioned difference.

The auxiliary positioning jig 82A has a first positioning portion 832A and a second positioning portion 834A different from the first positioning portion 832 and the second positioning portion 834 of the auxiliary positioning jig 82, respectively. Moreover, the auxiliary positioning jig 82A has the two first positioning holes 836 but does not have the second positioning holes 838. Each of the first positioning holes 836 is located on the boundary 82X between the first wall 824 and the second wall 826. In other words, the first positioning portion 832A and the second positioning portion 834A share the first positioning holes 836. The auxiliary positioning jig 82A has the structure same as that of the auxiliary positioning jig 82 except the aforementioned difference.

Referring to FIGS. 3 and 22, in an arrangement step of a forming method of the connector assembly 10A, each of the first positioning projections 816 of the main positioning jig 80A passes through the corresponding first positioned hole 526 of the first wiring sheet 50A and the corresponding second positioned hole 626 of the second wiring sheet 60A to be inserted into the corresponding first positioning hole 836 of the auxiliary positioning jig 82A. According to the present modification, the connector assembly 10A can be assembled similarly to the connector assembly 10 (see FIG. 1).

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A forming method of a connector assembly, the forming method comprising:
   preparing a main connector, a first wiring sheet, a second wiring sheet and an auxiliary connector, the main connector having a receiving portion, a first wall and a second wall, the first wall and the second wall being located opposite to each other across the receiving portion in a lateral direction, the first wiring sheet having a first positioned portion, a first deformable portion and a first contact, the first deformable portion extending from the first positioned portion along the lateral direction, the first contact being provided on the first deformable portion, the second wiring sheet having a second positioned portion, a second deformable portion and a second contact, the second deformable portion extending from the second positioned portion along the lateral direction, the second contact being provided on the second deformable portion, the auxiliary connector having a received portion, at least one of the receiving portion and the received portion being provided with a resilient portion which is resiliently deformable;
   arranging the main connector, the first wiring sheet, the second wiring sheet and the auxiliary connector by using a positioning jig so that the main connector, the first wiring sheet, the second wiring sheet and the auxiliary connector are arranged in this order upward in an upper-lower direction perpendicular to the lateral direction, the positioning jig having an accommodation portion, a first positioning portion and a second positioning portion, the accommodation portion being capable of accommodating the main connector with regulation of a movement of the main connector in the lateral direction, each of the first positioning portion and the second positioning portion being located, at least in part, outward of the accommodation portion in the lateral direction, the main connector being accommodated in the accommodation portion, the first contact being arranged to face upward, the first positioned portion being positioned by the first positioning portion, the first deformable portion being located to extend over the receiving portion onto the second wall, the second contact being arranged to face downward, the second positioned portion being positioned by the second positioning portion, the second deformable portion being located on the first deformable portion to extend over the receiving portion onto the first wall, the received portion being located on the receiving portion via the first deformable portion and the second deformable portion; and
   moving the auxiliary connector downward to press the first deformable portion and the second deformable portion downward by the received portion so that the first deformable portion and the second deformable portion are deformed and pushed into the receiving portion, wherein when the moving is ended, the first contact and the second contact are located within the receiving portion to be in contact with each other, and the resilient portion applies a resilient force that keeps the first contact and the second contact in contact with each other.

2. The forming method as recited in claim 1, wherein:
   the positioning jig includes a main positioning jig and an auxiliary positioning jig which are separable from each other;
   the main positioning jig has the accommodation portion;
   the auxiliary positioning jig has an auxiliary accommodation portion;
   the auxiliary accommodation portion passes through the auxiliary positioning jig in the upper-lower direction, and is capable of accommodating the received portion of the auxiliary connector with allowance of a movement of the received portion in the upper-lower direction;
   each of the first positioning portion and the second positioning portion is provided on at least one of the main positioning jig and the auxiliary positioning jig; and
   in the arranging, the main positioning jig and the auxiliary positioning jig are combined to each other to sandwich the first wiring sheet and the second wiring sheet therebetween in the upper-lower direction, and the received portion is accommodated in the auxiliary accommodation portion.

3. The forming method as recited in claim 1, wherein:
   the positioning jig has a first block and a second block;
   the first block and the second block are located opposite to each other across the accommodation portion in the lateral direction;
   the first block is provided with the first positioning portion; and
   the second block is provided with the second positioning portion.

4. The forming method as recited in claim 1, the forming method comprising moving a pressing jig downward, wherein:
   the moving the auxiliary connector downward is a part of the moving the pressing jig downward; and
   in the moving the pressing jig downward, the downward-moved pressing jig presses and moves the auxiliary connector downward.

5. The forming method as recited in claim 1, wherein:
   the main connector comprises a holding member and a resilient member;
   the resilient member is held by the holding member;
   the holding member has a recessed portion;
   the receiving portion is formed of the recessed portion and the resilient member which works as the resilient portion;
   the resilient member has at least two projecting portions and a resilient support portion;
   the at least two projecting portions are located, at least in part, within the recessed portion and face each other in the lateral direction; and
   the resilient support portion supports each of the at least two projecting portions.

6. A connector assembly comprising a main connector, a first wiring sheet, a second wiring sheet and an auxiliary connector, wherein:
   the main connector has a receiving portion, a first wall and a second wall;
   the first wall and the second wall are located opposite to each other across the receiving portion in a lateral direction;

the first wiring sheet has a first positioned portion, a first deformable portion and a first contact;

the first deformable portion extends from the first positioned portion along the lateral direction;

the first contact is provided on the first deformable portion;

the second wiring sheet has a second positioned portion, a second deformable portion and a second contact;

the second deformable portion extends from the second positioned portion along the lateral direction;

the second contact is provided on the second deformable portion;

the auxiliary connector has a received portion;

at least one of the receiving portion and the received portion is provided with a resilient portion which is resiliently deformable;

the main connector, the first wiring sheet, the second wiring sheet and the auxiliary connector are arranged in this order upward in an upper-lower direction perpendicular to the lateral direction;

each of the first positioned portion and the second positioned portion is located, at least in part, outward of the main connector in the lateral direction;

the received portion is received in the receiving portion and presses the first deformable portion and the second deformable portion; and the first contact and the second contact are located within the receiving portion to be in contact with each other, and the resilient portion applies a resilient force that keeps the first contact and the second contact in contact with each other.

7. The connector assembly as recited in claim 6, wherein:
the first positioned portion is provided with a first positioned hole; and
the second positioned portion is provided with a second positioning hole.

8. The connector assembly as recited in claim 6, wherein the auxiliary connector is entirely located between opposite edges of the receiving portion in the lateral direction.

9. The connector assembly as recited in claim 8, wherein the auxiliary connector is entirely located within the receiving portion.

10. The connector assembly as recited in claim 6, wherein:
the receiving portion extends along a longitudinal direction perpendicular to both the lateral direction and the upper-lower direction; and
the auxiliary connector extends along the longitudinal direction while having a constant shape in a plane perpendicular to the longitudinal direction.

11. The connector assembly as recited in claim 6, wherein:
the main connector comprises a holding member and a resilient member;
the resilient member is held by the holding member;
the holding member has a recessed portion;
the receiving portion is formed of the recessed portion and the resilient member which works as the resilient portion;
the resilient member has at least two projecting portions and a resilient support portion;
the at least two projecting portions are located, at least in part, within the recessed portion and face each other in the lateral direction;
the resilient support portion supports each of the at least two projecting portions; and
the received portion is sandwiched between and pressed by the at least two projecting portions via the first deformable portion and the second deformable portion in the lateral direction.

12. The connector assembly as recited in claim 11, wherein the resilient member is a spring made of metal.

13. A connector pair comprising two connectors which work as the main connector and the auxiliary connector of the connector assembly as recited in claim 6.

* * * * *